United States Patent
Lee et al.

(10) Patent No.: US 7,623,377 B2
(45) Date of Patent: Nov. 24, 2009

(54) FLASH MEMORY DEVICE HAVING SINGLE PAGE BUFFER STRUCTURE AND RELATED PROGRAMMING OPERATIONS

(75) Inventors: Seung-Jae Lee, Hwaseong-si (KR); Jin-Sung Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/255,825

(22) Filed: Oct. 22, 2008

(65) Prior Publication Data
US 2009/0040822 A1    Feb. 12, 2009

Related U.S. Application Data

(62) Division of application No. 11/347,216, filed on Feb. 6, 2006, now Pat. No. 7,457,158.

(30) Foreign Application Priority Data
Jul. 4, 2005    (KR) ............... 10-2005-0059805

(51) Int. Cl.
    *G11C 16/04*    (2006.01)
(52) U.S. Cl. ............... 365/185.03; 365/185.08; 365/185.22; 365/185.17; 365/185.24
(58) Field of Classification Search ............ 365/185.03, 365/185.08, 185.22, 185.17, 185.24
    See application file for complete search history.

(56) References Cited

U.S. PATENT DOCUMENTS

| | | | |
|---|---|---|---|
| 6,288,936 B1 | 9/2001 | Kawamura | |
| 6,442,081 B1 | 8/2002 | Nagashima | |
| 6,996,014 B2 | 2/2006 | Lee et al. | |
| 7,035,144 B2 * | 4/2006 | Kim et al. | 365/185.18 |
| 7,260,017 B2 | 8/2007 | Won | |
| 7,457,157 B2 * | 11/2008 | Kim | 365/185.03 |
| 2002/0126531 A1 | 9/2002 | Hosono et al. | |
| 2005/0018488 A1 | 1/2005 | Kim et al. | |

FOREIGN PATENT DOCUMENTS

| | | |
|---|---|---|
| JP | 2001325796 A | 11/2001 |
| JP | 2002025277 A | 1/2002 |
| JP | 2005032431 A | 2/2005 |
| KR | 1020020003074 A | 1/2002 |
| KR | 1020010100809 B1 | 11/2004 |
| KR | 1020050007653 A | 1/2005 |

* cited by examiner

*Primary Examiner*—Connie C Yoha
(74) *Attorney, Agent, or Firm*—Volentine & Whitt, PLLC

(57) ABSTRACT

A flash memory device is provided, and the flash memory device comprises memory cells, a sense node connected to a selected bit line, a load circuit connected to the sense node, and first and second sense and register circuits, each connected to the sense node. The first sense and register circuit is configured to store a first data value in accordance with the voltage level of the sense node during an initial read interval of a multi-bit program operation. The load circuit is configured to selectively pre-charge the sense node in accordance with the data value stored in the first sense and register circuit during a verify read interval of the multi-bit program operation. A multi-bit programming method for the flash memory device is also provided.

11 Claims, 18 Drawing Sheets

FLASH MEMORY DEVICE HAVING SINGLE PAGE BUFFER STRUCTURE AND RELATED PROGRAMMING OPERATIONS

CROSS-REFERENCE TO RELATED APPLICATION

This is a divisional of application Ser. No. 11/347,216 filed on Feb. 6, 2006, which is incorporated herein by reference in its entirety.

BACKGROUND

1. Field of the Invention

The present invention is related to a semiconductor memory device. In particular, the present invention is related to a non-volatile semiconductor memory device capable of storing multi-bit data.

This application claims priority to Korean Patent Application No. 2005-59805, filed on Jul. 4, 2005, the subject matter of which is hereby incorporated by reference in its entirety.

2. Description of the Related Art

Semiconductor memory devices are vital components in the design of digital logic systems such as computers, and substantially enable microprocessor-based applications ranging from satellites to consumer electronics. Therefore, advances in the fabrication of semiconductor memory devices, including process enhancements and technological developments achieved through scaling for higher integration density and faster operational speeds, help establish performance standards for other digital logic families. A semiconductor memory device may be a volatile random access memory (RAMs) device or a non-volatile memory device. In RAM, logic information is stored either by setting up the logic state of a bi-stable flip-flop, as in a static random access memory (SRAM), or through charging a capacitor, as in a dynamic random access memory (DRAM). In both SRAMs and DRAMs, the stored data may be read from memory as long as power is supplied to the device, but the stored data is lost when power is not supplied. Hence, SRAMs and DRAMs are called volatile semiconductor memory devices.

Non-volatile semiconductor devices, such as MROMs, PROMs, EPROMs, and EEPROMs, are capable of storing data even when power is not supplied to the device. Depending upon the fabrication technology used, a non-volatile semiconductor device may or may not be reprogrammable (i.e., data storage in the device may be changeable or permanent). Non-volatile semiconductor devices are used for program and microcode storage in a wide variety of applications, such as those common to the computer, avionics, telecommunications, and consumer electronics industries.

A combination of volatile and non-volatile memory storage is available in single chip devices, such as non-volatile SRAM (nvRAM). Such devices are used in systems that require fast, programmable non-volatile memory. In addition, dozens of special memory architectures containing additional logic circuitry adapted to optimize memory device performance for application-specific tasks have been created.

As compared with other types of memory devices, it is relatively difficult to write data to, or erase data from non-volatile semiconductor devices, such as the MROM, PROM, and EPROM. On the other hand, EEPROM devices may be electrically erased or written. As a result, the use of EEPROM devices has been expanded and to auxiliary memories or system programming devices requiring continuous update. In particular, a flash EEPROM (hereinafter referred to as "a flash memory device") has a higher degree of integration than a conventional EEPROM device, so it is preferable to use a flash memory device in a large auxiliary memory as opposed to a conventional EEPROM device. Also, a NAND-type flash memory device (i.e., a flash memory device comprising NAND-type flash memory) has a higher degree of integration than a well-known, NOR-type flash memory device (i.e., a flash memory device comprising NOR-type flash memory).

A NAND-type flash memory device comprises a memory cell array in which digital information is stored, and the memory cell array comprises a plurality of cell strings (called NAND strings). The flash memory device also comprises a page buffer circuit that stores data in the memory cell array and reads data from the memory cell array. As is well known in the art, memory cells of a NAND-type flash memory device are erased and programmed using Flowler-Nordheim tunneling current. Erase and program methods for NAND-type flash memory devices are disclosed, for example, in U.S. Pat. Nos. 5,473,563 and 5,696,717, the subject matter of which is hereby incorporated by reference in its entirety.

Figure (FIG.) 1 is a block diagram showing a conventional flash memory device. As illustrated in FIG. 1, a flash memory device 10 comprises a memory cell array 12, a row decoder circuit 14, and a page buffer circuit 16. Memory cell array 12 comprises memory cells arranged along rows (i.e., along word lines) and along columns (i.e., along columns that correspond to bit lines). The memory cells are configured in a NAND string structure. The word lines (i.e., the rows) of memory cell array 12 are driven by row decoder circuit 14, and the bit lines (i.e., the columns) are driven by page buffer circuit 16. Each memory cell stores 1-bit data or multi-bit data (e.g., 2-bit data). A page buffer circuit configured to store 2-bit data in each memory cell must be designed differently from a page buffer circuit configured to store 1-bit data in each memory cell. As is well known in the art, 1-bit data is stored in a memory cell by a page buffer circuit comprising one latch, while 2-bit data is stored in a memory cell by a page buffer circuit comprising two latches.

Exemplary page buffer circuits that store 2-bit data in memory cells are disclosed, for example, in U.S. Pat. Nos. 5,768,188; 5,862,974; 5,966,326; and, 5,982,663, the subject matter of which is hereby incorporated by reference in its entirety.

In each of the references mentioned above, the disclosed page buffer circuit comprises two latches and requires sense circuits to transfer data stored in memory cells to respective latches during a read operation. Since sense paths to the respective latches differ, a mismatch between sense margins may arise. In particular, in a flash memory device that stores multi-bit data, read errors are caused by the mismatch of sense margins.

With continuing demand for a higher integration density, flash memory devices are increasingly required to perform various operations, such as cache program, page copy-back, etc. In the cache program operation, while data is programmed during the current program interval, data to be programmed during the next program interval is loaded into a page buffer circuit. In the page copy-back operation, data is moved from one page to another through a page buffer circuit. Like a multi-bit flash memory device, a page buffer circuit requires two latches to perform these operations.

Exemplary page buffer circuits adapted to perform the above-mentioned operations are disclosed, for example, U.S. Pat. Nos. 6,717,857 and 6,671,204, the subject matter of which is hereby incorporated by reference in its entirety.

Unfortunately, a conventional page buffer circuit capable of performing the page copy-back and/or cache program operations has a different structure than a conventional page buffer circuit capable of performing multi-bit programming. Thus, separate page buffer circuits must be provided to perform all of these disparate operations. Unfortunately, the provision of multiple page buffer circuits having different structures drives the cost of memory devices higher.

SUMMARY OF THE INVENTION

Embodiments of the invention provide a flash memory device capable of performing multi-bit program and read operations, single bit program and read operations, a cache program operation, and/or a page copy-back operation using a single page buffer structure.

In one embodiment, the invention provides a flash memory device comprising a plurality of memory cells arranged along a plurality of word lines and a plurality of bit lines, a sense node connected to a selected bit line, a load circuit connected to the sense node and adapted to pre-charge the sense node, and a first sense and register circuit connected to the sense node and adapted to store a first data value in accordance with a first voltage level of the sense node, wherein the first voltage level of the sense node corresponds to a second data value stored in a selected memory cell.

In another embodiment, the invention provides a flash memory device comprising a plurality of memory cells arranged along a of plurality of word lines and a plurality of bit lines, a bit line select and bias block configured to select a group of bit lines comprising at least one bit line of the plurality of bit lines, and a page buffer block comprising a plurality of page buffers, each of which corresponds to at least one bit line of the plurality of bit lines. Each of the page buffers comprises a sense node connected to a selected bit line through the bit line select and bias block; a first sense and register circuit connected to the sense node and configured to store a first data value in accordance with a first voltage level of the sense node, wherein the first voltage level of the sense node corresponds to a second data value stored in a selected memory cell; and a second sense and register circuit connected to the sense node and configured to store a third data value in accordance with a second voltage level of the sense node, wherein the second voltage level of the sense node corresponds to a fourth data value stored in a selected memory cell. Each of the page buffers further comprises first and second PMOS transistors connected in series between a power supply voltage and the sense node, wherein the second PMOS transistor is controlled in accordance with a pre-charge control signal; a transistor pair that comprises a first NMOS transistor and a third PMOS transistor, that is controlled in accordance with a first control signal, and that is configured to provide a first signal to a gate of the first PMOS transistor in accordance with a fifth data value stored in the first sense and register circuit; and a second NMOS transistor that is controlled in accordance with an inverted version of the first control signal and connected between the gate of the first PMOS transistor and a ground voltage.

In yet another embodiment, the invention provides a multi-bit program method for a flash memory device comprising memory cells arranged along a plurality of bit lines and a plurality of word lines. The method comprises an MSB program operation, and the MSB program operation comprises storing a first data value in a first sense and register circuit during an initial read interval, wherein the first data value corresponds to a second data value stored in a selected memory cell; selectively pre-charging a sense node in accordance with the first data value during a "00" verify read interval; and storing a third data value in a second sense and register circuit during the "00" verify read interval, wherein the third data value corresponds to a fourth data value stored in the selected memory cell.

BRIEF DESCRIPTION OF THE DRAWINGS

Exemplary embodiments of the invention will be described hereinafter with reference to the accompanying drawings, in which like reference symbols indicate the same or similar components. In the drawings.

DESCRIPTION OF THE EXEMPLARY EMBODIMENTS

This application is related to commonly-assigned, co-pending applications [Ser. No. 11/363,030] and [Ser. No. 11/347,223], the subject matter of which is hereby incorporated by reference in its entirety.

Figure 1:
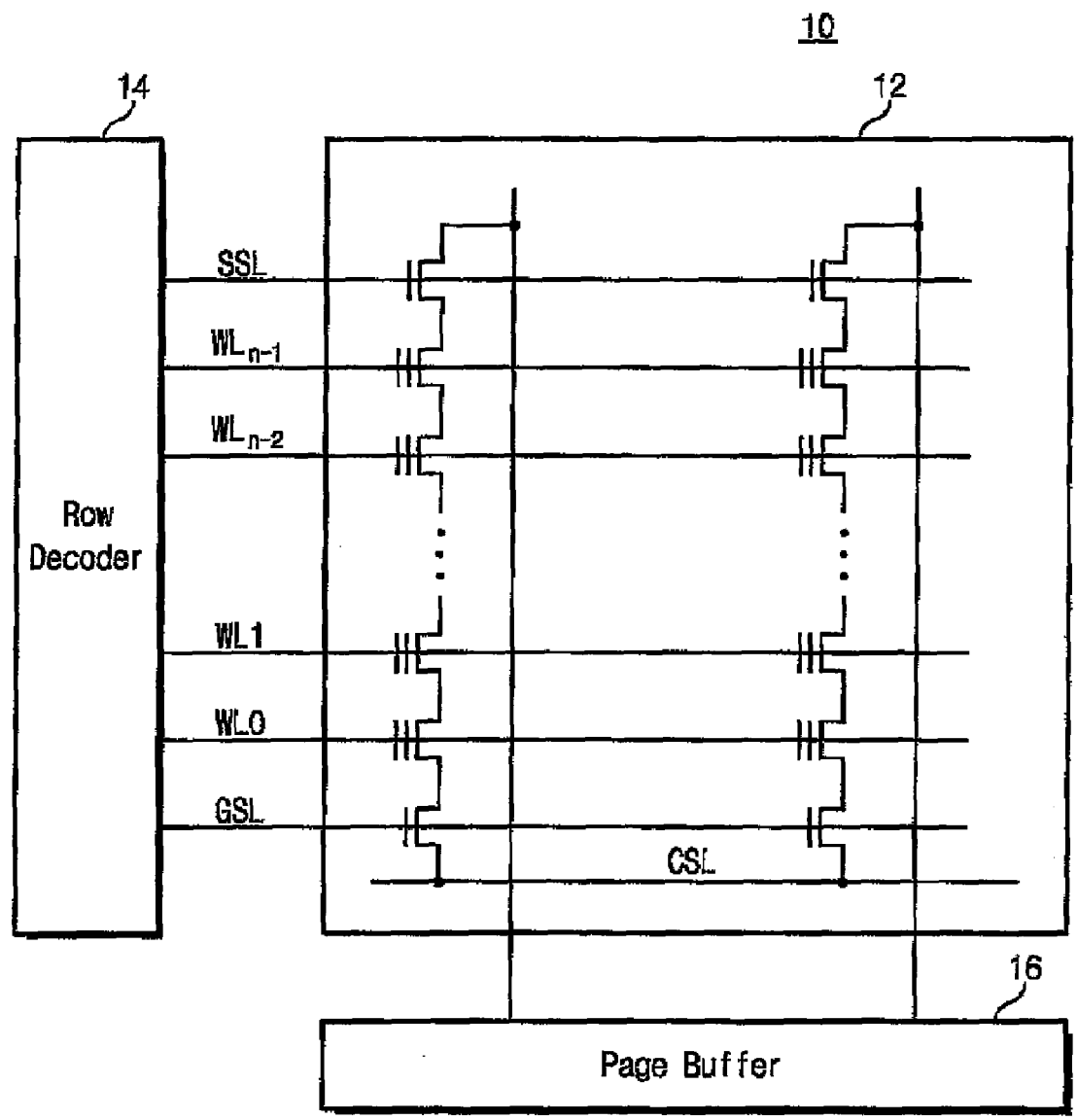
FIG. 1 is a block diagram showing a conventional flash memory device.
Figure 2:
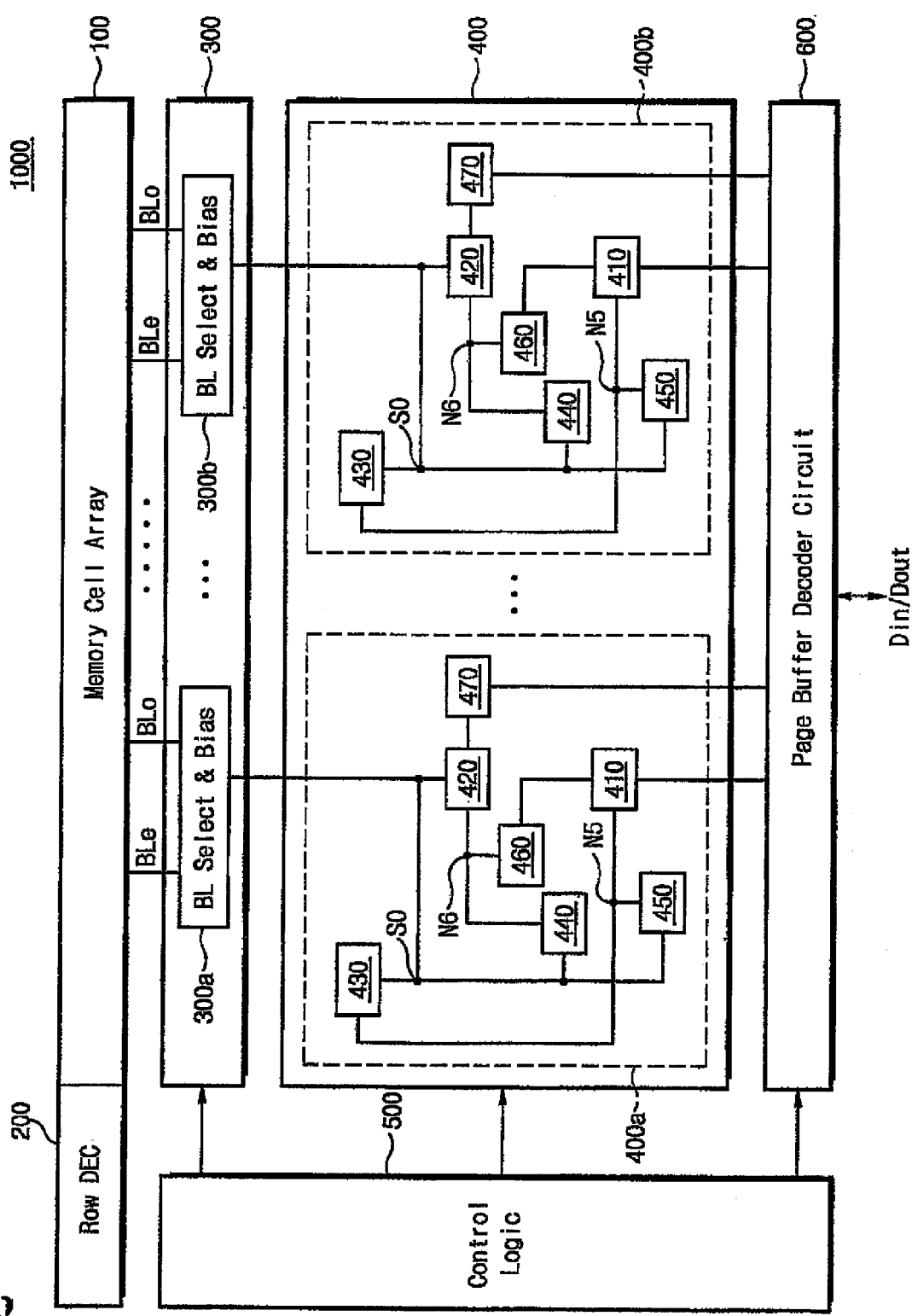
FIG. 2 is a block diagram of a flash memory device in accordance with the present invention.

Referring to FIG. 2, during an initial read interval, a first data value, which corresponds to a second data value stored in a selected memory cell, is stored in a first sense and register circuit 410, 450. Then, during a "00" verify read interval of an MSB program operation, a sense node S0 is selectively pre-charged in accordance with the first data value. Subsequently, during the "00" verify read interval, a third data value, which corresponds to a fourth data value stored in the selected memory cell, is stored in a second sense and register circuit 420, 440. When the first data value corresponds to the data value "11" (i.e., when the second data value stored in the selected memory cell is "11"), sense node S0 is not pre-charged during the "00" verify read operation. On the other hand, when the first data value corresponds to the data value "10" (i.e., when the second data value stored in the selected memory cell is "10"), sense node S0 is pre-charged during the "00" verify read operation. As used herein, storing a data value in a sense and register circuit, memory cell, or any other component of a flash memory device may refer to either changing the data value that is stored in that component or leaving the data value stored in that component unchanged.

FIG. 2 is a block diagram of a flash memory device in accordance with one embodiment of the invention. Referring to FIG. 2, a flash memory device 1000 comprises a memory cell array 100 adapted to store data. Memory cell array 100 comprises a plurality of memory cells arranged in rows and columns (i.e., arranged along a plurality of word lines and a plurality of bit lines). Each of the memory cells stores 1-bit data or multi-bit data (e.g., 2-bit data). A row decoder circuit 200 is adapted to select a row of memory cell array 100, drive the selected row with a first word line voltage, and drive each of the unselected rows with a second word line voltage. For example, during a first program operation, row decoder circuit 200 drives a selected row with a program voltage and unselected rows with a pass voltage, respectively. Also, for example, during a read operation, row decoder circuit 200 drives a selected row with a read voltage and unselected rows with a pass voltage, respectively. Examples of read operations are verify read operations of multi-bit and single bit operating modes, normal read operations, and the like.

Flash memory device 1000 further comprises; a bit line select and bias block 300, a page buffer block 400, a control logic block 500, and a page buffer decoder circuit 600.

Control logic block 500 controls bit line select and bias block 300. Bit line select and bias block 300 and is adapted to select a group of bit lines from among the plurality of bit lines of memory cell array 100. For example, during program and read operations, bit line select and bias block 300 is adapted to select either odd-numbered bit lines BLo or even-numbered bit lines BLe from among the plurality of bit lines. Thus, each row comprises two pages. Bit line select and bias block 300 comprises a plurality of bit line select and bias circuits 300a through 300b, each of which corresponds to two bit lines. Also, the bit lines of a given select and bias circuit (e.g., 300a) correspond to different pages, respectively, within a given row (i.e., word line). During a given operation, each of the bit line select and bias circuits 300a through 300b performs the operation on one of bit lines BLe or BLo. As described above, one row comprises two pages, but it will be clear to one skilled in the art that one row may comprise one page or more than two pages. Various conventionally understood bit line select and bias block 300 circuits may be incorporated into the working example. (See, for example, U.S. Pat. Nos. 6,717,857 and 6,671,204). Therefore, a detailed description of this block will not be given herein.

Page buffer block 400 operates as a sense amplifier or a write driver in accordance with the operating mode of flash memory device 1000. For example, during a program operating mode (i.e., during a first program operation), page buffer block 400 stores data input through page buffer decoder circuit 600 and drives bit lines selected by bit line select and bias block 300 with a program voltage (e.g., a ground voltage) or a program-inhibition voltage (e.g., a power supply voltage) in accordance with the data stored in page buffer block 400. During a read operating mode (i.e., during a read operation), page buffer block 400 senses data from a selected memory cell through a selected bit line (i.e., a bit line that corresponds to a selected memory cell). The sensed data is output to a data line bus (or to a component outside of flash memory device 1000). Control logic block 500 controls page buffer block 400. Page buffer block 400 comprises a plurality of page buffers 400a through 400b, each of which corresponds to a respective bit line select and bias circuit of bit line select and bias circuits 300a through 300b. Since page buffers 400a through 400b are each configured in the same way, the constituent elements of each of page buffers 400a through 400b will be described in more detail below in relation to only one exemplary page buffer (e.g., 400a).

Page buffer 400a comprises two registers 410 and 420, a load circuit 430, two sense circuits 440 and 450, a switch circuit 460, and a data output circuit 470. Register 410 is a cache register and register 420 is a main register. A sense node S0 is electrically connected to a bit line that is selected by a corresponding bit line select and bias circuit (i.e., bit line select and bias circuit 300a).

Register 410 is adapted to store external data that is provided through page buffer decoder circuit 600 during a data load interval. Register 410 is adapted to store data of a node N5 during an initial read interval of an MSB program operation. Register 420 is connected to sense node S0 and is adapted to store data of a node N6 during each sense interval. Register 420 is adapted to drive a bit line with a bit line bias voltage (e.g., a ground voltage or a power supply voltage) in accordance with its stored data value. Sense circuit 440 is connected to sense node S0, and selectively provides a voltage to node N6 in accordance with the voltage level of sense node S0. Sense circuit 450 is connected to sense node S0, and selectively provides a voltage to node N5 in accordance with the voltage level of sense node S0. In particular, sense circuit 450 selectively provides a voltage to node N5 in accordance with the voltage level of sense node S0 during the initial read interval of the MSB program operation. During the initial read interval, register 410 stores a data value in accordance with the voltage of node N5.

Still referring to FIG. 2, during each of the various read operations, load circuit 430 may pre-charge sense node S0 during. In particular, during a "00" verify read interval of the MSB program operation, load circuit 430 selectively pre-charges sense node S0 in accordance with the data value stored in register 410. For example, when a selected memory cell stores a data value of "11" after an LSB program operation, and will be programmed to store a data value of "01" during the MSB program operation, load circuit 430 is disabled in accordance with the data value stored in register 410 (i.e., signals are provided to load circuit 430 such that it will not pre-charge sense node S0), so sense node S0 will not be pre-charged during the "00" verify read interval in that case. When a selected memory cell stores a data value of "10" after an LSB program operation, and will be programmed to have a data value of "00" during the MSB program operation, load circuit 430 is enabled in accordance with the data stored in register 410 (i.e., signals are provided to load circuit 430 such that it will pre-charge sense node S0), so sense node S0 will be pre-charged during the "00" verify read interval in that case. These operations will be described in more detail below. During a data dump interval, data stored in register 410 is transferred to register 420. During the data dump interval, signals are provided to switch circuit 460 such that registers 410 and 420 are electrically connected to each other via switch circuit 460 (i.e., switch circuit 460 is enabled). Data output circuit 470 is adapted to output data stored in register 420 to page buffer decoder circuit 600.

Flash memory device 1000 can perform multi-bit program, cache program, and page copy-back functions using the page buffer structure described above. That is, a multi-bit program operation, a cache program operation, and a page copy-back operation may each be performed using a single page buffer structure. Thus, the management of separate memory devices to support those functions is not necessary when the page buffer described above is used in a flash memory device.

Figure 3:
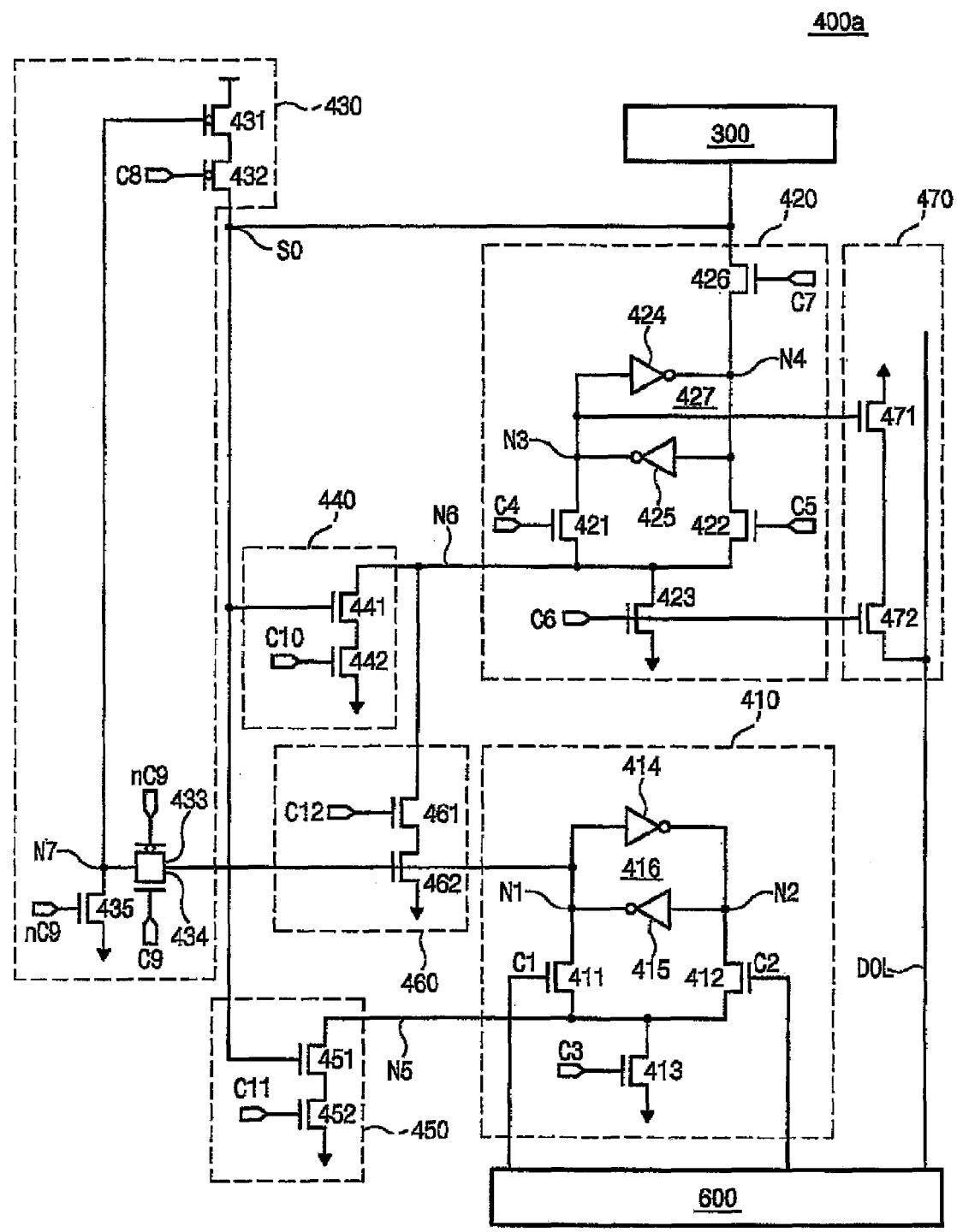
FIG. 3 is a circuit diagram of the page buffer illustrated in FIG. 2.

FIG. 3 is a circuit diagram of page buffer 400*a* of FIG. 2. As illustrated in FIG. 3, page buffer 400*a* comprises two registers 410 and 420, load circuit 430, two sense circuits 440 and 450, switch circuit 460, and data output circuit 470.

Register 410 comprises three NMOS transistors 411, 412, and 413; and two inverters 414 and 415. Inverters 414 and 415 are connected to form latch 416. NMOS transistor 411 has a source, a drain connected to a first latch node N1, and a gate connected to a control signal C1. NMOS transistor 413 has a gate connected to a control signal C3 and is connected between the source of transistor 411 and a ground voltage. NMOS transistor 412 has a gate connected to a control signal C2, a drain connected to a second latch node N2, and a source connected to the drain of NMOS transistor 413.

In this exemplary embodiment, control signals C1 and C2 have complementary logic levels during the data load interval, which is when latch 416 receives program data. For example, when the data value "1" is loaded into latch 416, control signal C1 has a logic high level and control signal C2 has a logic low level. When the data value "0" is loaded into latch 416, control signal C1 has a logic low level and control signal C2 has a logic high level. In order to reset latch 416, control signals C1 and C2 are set to a logic high level and a logic low level, respectively, and control signal C3 is set to a logic high level. Control signal C3 is provided by control logic block 500 of FIG. 2 and is activated (i.e., set to a logic high level) during the data load interval. As used herein, "program data" is a representative data value that corresponds to an actual data value that will be programmed into a selected memory cell. In one embodiment, program data may be LSB program data (i.e., program data that represents an actual data value to be programmed into a selected memory cell during an LSB program operation), or MSB program data (i.e., program data that represents an actual data value to be programmed into a selected memory cell during an MSB program operation). Also, as used herein, when a data value is said to be "loaded into," "loaded in," "stored in," etc., a latch (e.g., latch 416), it means that logic levels are stored in the latch nodes of the latch (e.g., first and second latch nodes N1 and N2) in a way that represents the data value to be stored (or loaded, etc.) in the latch. Also, as used herein, the term "activate" as used in reference to a signal means to set the signal to a logically high level. Similarly, the term "deactivate" means setting a signal to a logically low level. (In this regard, however, low and high are merely selected logic examples and could be easily reversed in their nature).

Register 420 comprises four NMOS transistors 421, 422, 423, and 426; and two inverters 424 and 425. Inverters 424 and 425 are connected to form a latch 427. NMOS transistor 421 has a gate connected to receive a control signal C4, a drain connected to a third latch node N3, and a source connected to a node N6. NMOS transistor 422 has a gate connected to receive a control signal C5, a drain connected to a fourth latch node N4, and a source connected to node N6. NMOS transistor 423 has a gate connected to receive a control signal C6, a drain connected to node N6, and a source connected to a ground voltage. NMOS transistor 426 has a gate that is connected to receive a control signal C7 and is connected between sense node S0 and latch node N4.

In this exemplary embodiment, control logic block 500 of FIG. 2 provides control signals C4, C5, C6, and C7 to register 420. Control signal C5 is activated when data stored in register 410 is transferred through switch circuit 460. Control signal C4 is activated when latch 427 is reset, and during a sense interval of each read operation. Control signal C6 is activated at when latch 427 is reset, and during a data output interval. Control signal C7 is activated when data in latch 427 is transferred to a bit line during a program interval.

Sense circuit 440 comprises two NMOS transistors 441 and 442. NMOS transistor 441 has a drain connected to node N6, a source that is grounded via NMOS transistor 442, and a gate that is connected to sense node S0. NMOS transistor 442 is controlled in accordance with a control signal C10 that functions as a latch signal. Sense circuit 450 comprises two NMOS transistors 451 and 452. NMOS transistor 451 has a drain connected to node N5, a source that is grounded via NMOS transistor 452, and a gate that is connected to sense node S0. NMOS transistor 452 is controlled in accordance with a control signal C11 that functions as a latch signal. Control logic block 500 of FIG. 2 provides control signals C10 and C11 to sense circuits 440 and 450, respectively. Control signal C10 is activated when a sense operation is carried out by main register 420, and control signal C11 is activated when a sense operation is carried out by cache register 410.

Load circuit 430 comprises three PMOS transistors 431, 432, and 433; and two NMOS transistors 434 and 435. PMOS transistors 431 and 432 are connected in series between a power supply voltage and the sense node S0. PMOS transistor 432 is controlled by a pre-charge control signal C8. Control logic block 500 of FIG. 2 provides pre-charge control signal C8 to load circuit 430. PMOS transistor 431 is controlled in accordance with the voltage of a node N7. NMOS transistor 434 is connected between node N7 and first latch node N1 of register 410 and is controlled in accordance with a control signal C9. NMOS transistor 435 is connected between the node N7 and a ground voltage and is controlled in accordance with an inverted control signal nC9. Control signal C9 is activated only during the "00" verify read interval of the MSB program operation and is deactivated during all remaining intervals, so control signal C9 indicates when page buffer 400*a* is in the "00" verify read interval. Thus, during the "00" verify read interval, PMOS transistor 431 is selectively turned on in accordance with the voltage of node N7 (i.e., in accordance with the data value stored in register 410). During all intervals except for the "00" verify read interval, the gate of PMOS transistor 431 is grounded through NMOS transistor 435.

Switch circuit 460 comprises two NMOS transistors 461 and 462 that are connected in series between node N6 and a ground voltage. NMOS transistor 461 is controlled by a control signal C12 that functions as a dump signal. NMOS transistor 462 is controlled in accordance with the data value stored in first latch node N1 of cache register 410. Control logic block 500 of FIG. 2 provides control signal C12 to switch circuit 460, and switch circuit 460 is activated during each data dump interval. Data output circuit 470 comprises two NMOS transistors 471 and 472 that are connected in series between a signal line DOL and a ground voltage. NMOS transistor 471 is controlled in accordance with data of latch node N3 in register 420, and NMOS transistor 472 is controlled by control signal C6.

In this exemplary embodiment, cache register 410 and sense circuit 450 operate together as a sense and register circuit to sense and store data in accordance with the voltage level of sense node S0. Also in this embodiment, main register 420 and sense circuit 440 operate together as a sense and register circuit to sense and store data in accordance with the voltage level of sense node S0.

A multi-bit program operation for the flash memory device of the present invention will now be described generally.

Figure 4A:
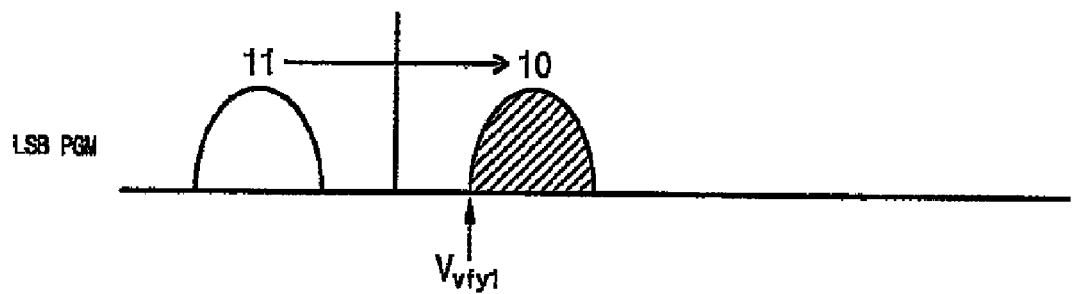
FIGS. 4A and 4B are diagrams illustrating a multi-bit program operation in accordance with the present invention.
Figure 4B:
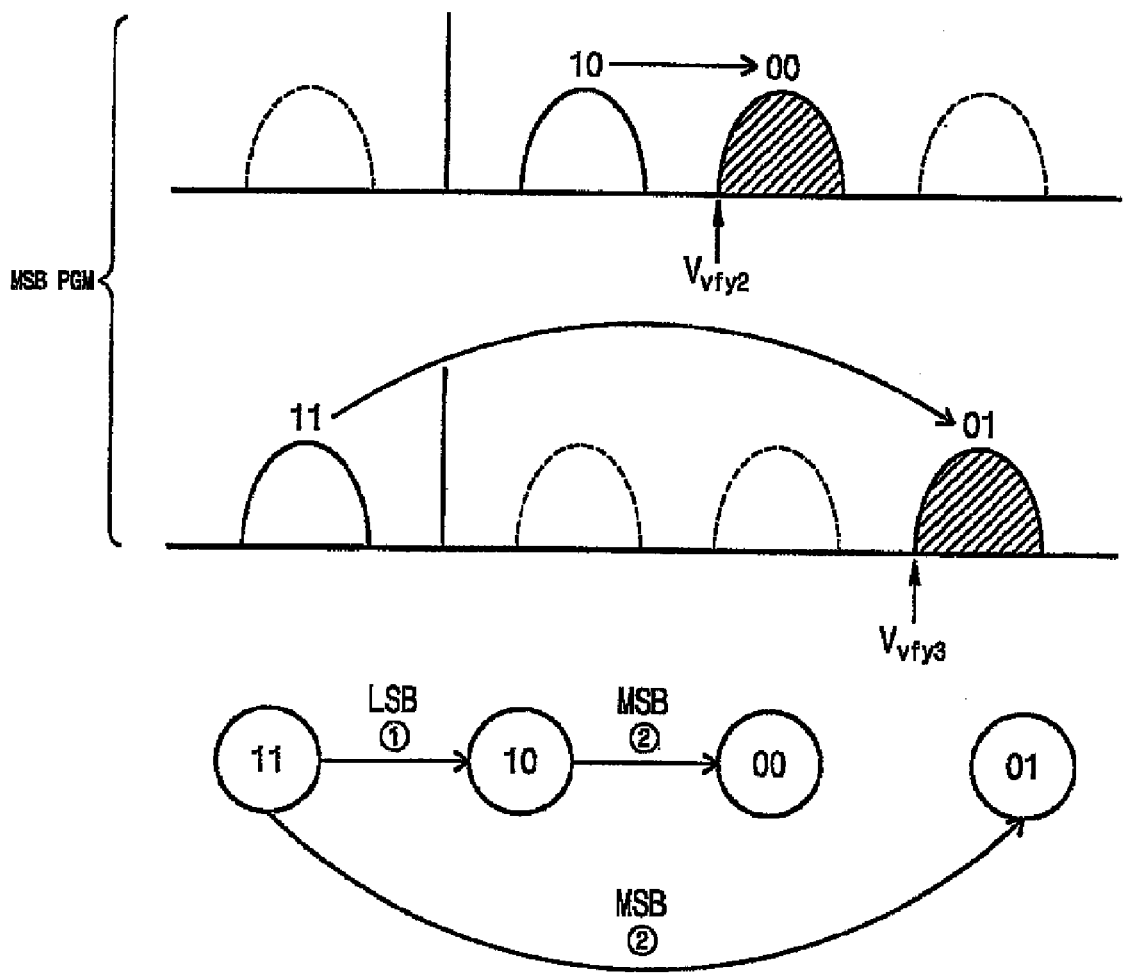

To store 2-bit data in a selected memory cell, a flash memory device in accordance with the present invention performs both an LSB program operation and an MSB program operation. Through the LSB and MSB program operations, a selected memory cell is programmed to store one of the following data values: "11," "10," "00," or "01." A memory cell storing a data value of "11" is an erased memory cell, and a memory cell storing a data value of "10" has a threshold voltage higher than that of a memory cell storing a data value of "11." In addition, a memory cell storing a data value of "00" has a threshold voltage higher than that of a memory cell storing a data value of "10." Finally, a memory cell storing a data value of "01" has a threshold voltage higher than that of a memory cell storing a data value of "00." Under the conditions set forth above, after an LSB program operation has been performed on a selected memory cell, the selected memory cell stores a data value of either "11" (i.e., the selected memory cell is an erased memory cell), or "10," as illustrated in FIG. 4A. After performing the MSB program operation, which is performed after the LSB program operation, a selected memory cell that stored a data value of "11" after the LSB program operation will store a data value of either "11" or "01," while a selected memory cell that stored a data value of "10" after the LSB program operation will store a data value of "10" or "00," as illustrated in FIG. 4B.

Figure 5:
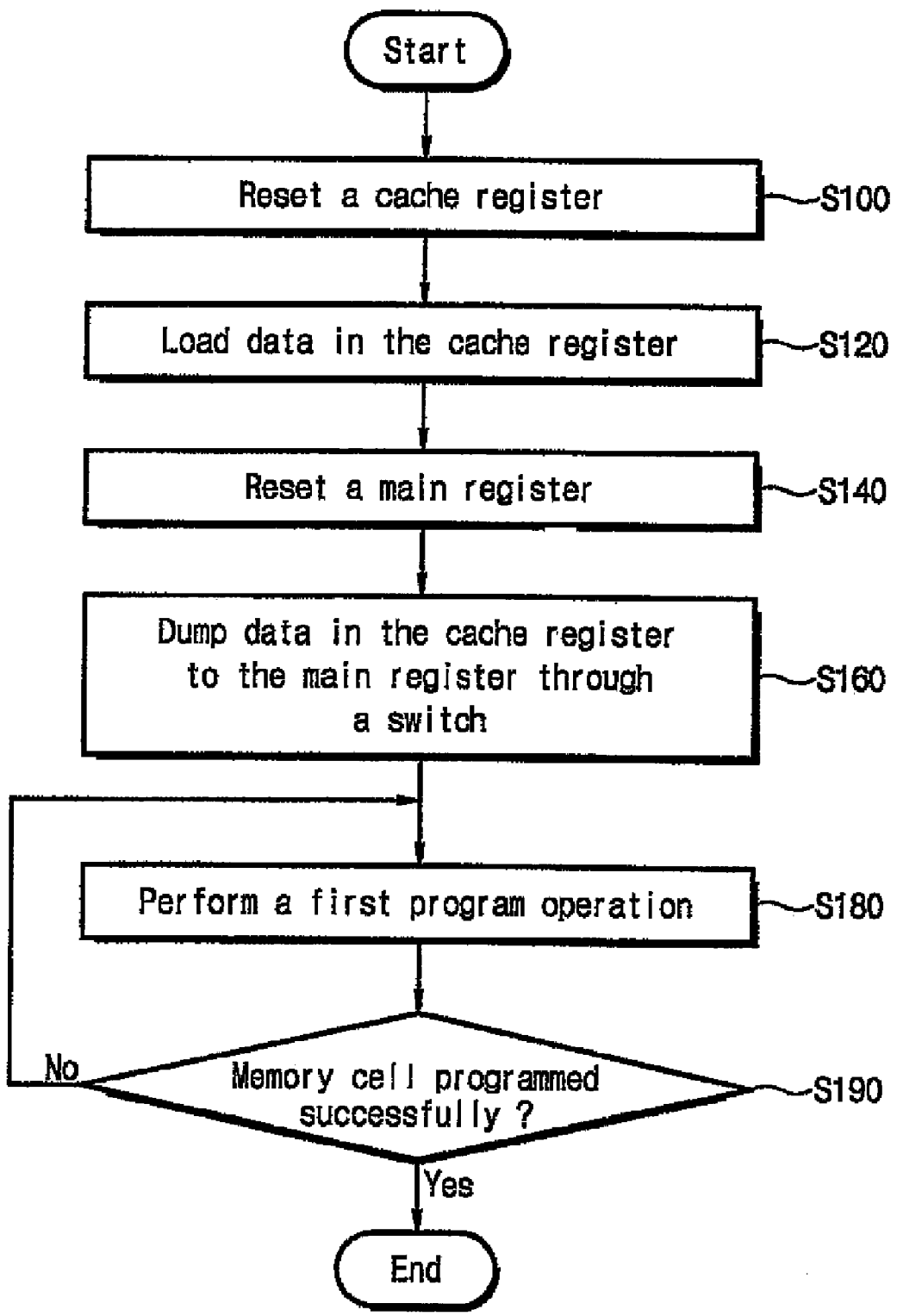
FIG. 5 is a flowchart describing an LSB program operation of a flash memory device in accordance with the present invention.
Figure 6:
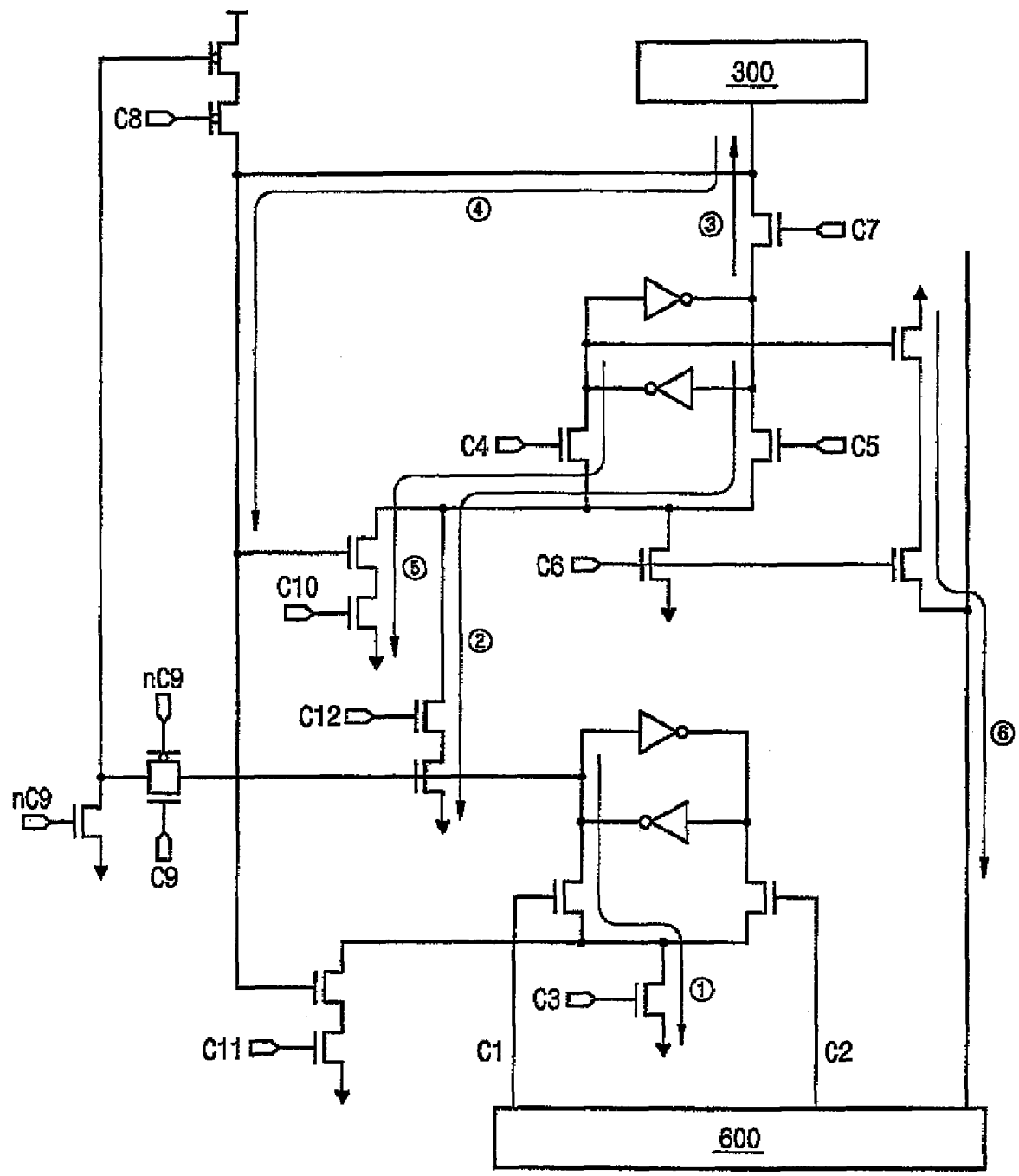
FIG. 6 is a circuit diagram illustrating the flow of data through portions of a flash memory device in accordance with the present invention during the LSB program operation.

FIG. 5 is a flowchart describing an LSB program operation of a flash memory device in accordance with the present invention, and FIG. 6 is a circuit diagram illustrating the flow of data through portions of a flash memory device in accordance with the present invention during the LSB program operation. An LSB program operation will now be described with reference to FIGS. 3, 4A, 5, and 6. An LSB program operation is performed through an iteration of program loops. Each LSB program loop comprises an LSB program interval that comprises a first program operation and an LSB verify interval that comprises an LSB verify read operation. The LSB verify read operation is called a "10" verify read operation.

Once the LSB program operation commences, first latch node N1 and second latch node N2 of cache register 410 are reset to a logic low level and a logic high level, respectively, by activating control signals C1 and C3 (S100). After resetting cache register 410, LSB program data is loaded into cache register 410 through page buffer decoder circuit 600 (S120). During a data load interval, LSB program data having a value of either "1" or "0" may be loaded into cache register 410, and in either case control signal C3 is set to a logic high level. LSB program data having a value of "1" is loaded into cache register 410 by setting control signal C1 to a logic high level and setting control signal C2 to a logic low level. Thus, first latch node N1 is grounded through NMOS transistors 411 and 413 (i.e., through signal path ① of FIG. 6), which sets first latch node N1 to a logic low level and second latch node N2 to a logic high level. On the other hand, LSB program data having a value of "0" is loaded into cache register 410 by setting control signal C1 to a logic low level and setting control signal C2 to a logic high level. Thus, second latch node N2 is grounded through NMOS transistors 412 and 413, and as a result first latch node N1 is set to a logic high level and second latch node N2 is set to a logic low level.

After the LSB program data is loaded into cache register 410, a first reset operation is performed on main register 420 and, as a result, third latch node N3 is set to a logic low level and fourth latch node N4 is set to a logic high level (S140). The first reset operation is performed on main register 420 by activating control signals C4 and C6. After resetting main register 420, the LSB program data that was previously loaded into cache register 410 is transferred to main register 420 through switch circuit 460 during a data dump interval (S160). The LSB program data is transferred by activating control signals C5 and C12. When control signals C5 and C12 are activated, NMOS transistors 422 and 461, respectively, are turned on. When LSB program data having a value of "1" was previously loaded into cache register 410, first latch node N1 was set to a logic low level, so third latch node N3 of main register 420 retains the logic low level at which it was set when main register 420 was reset. That is, NMOS transistor 462 is not turned on because first latch node N1 has a logic low level; and thus, signal path ② (of FIG. 6) is not formed between node N6 and a ground voltage. Thus, third latch node N3 maintains its logic low level and fourth latch node N4 maintains its logic high level (i.e., main register 420 maintains the state it was in after the first reset operation). On the other hand, when LSB program data having a value of "0" was previously loaded into cache register 410, first latch node N1 was set to a logic high level, so fourth latch node N4 of main register 420 is grounded through NMOS transistors 422, 461 and 462 (i.e., signal path ② of FIG. 6). Thus, third latch node N3 and fourth latch node N4 of main register 420 are set to a logic high level and a logic low level, respectively.

Once the LSB program data is transferred from cache register 410 to main register 420 as described above, the first program operation is executed on a selected memory cell (S180). When the first program operation is executed, the voltage level of a selected bit line (i.e., the bit line that corresponds to the selected memory cell) is determined through signal path ③ (of FIG. 6) in accordance with the data value stored in main register 420. The first program operation is well known in the art, so a description thereof is omitted. After the first program operation is performed, an operation is performed to determine whether or not the selected memory cell has been programmed properly (S190). That is, an LSB verify read operation (i.e., the "10" verify read operation) is performed. During the "10" verify read operation, a verify voltage Vvfy1 (refer to FIG. 4A) is applied to the selected word line (i.e., the word line that corresponds to the selected memory cell) and a resulting voltage variation of the selected bit line is reflected on sense node S0 through signal path ④ (of FIG. 6). For example, if a selected memory cell has a threshold voltage that is lower than verify voltage Vvfy1, the voltage level of sense node S0 (in accordance with the voltage level of the selected bit line) decreases toward a ground voltage. When this occurs, the low voltage of sense node S0 turns off NMOS transistor 441 of sense circuit 440. Thus, if a selected memory cell has a threshold voltage that is lower than verify voltage Vvfy1 during the "10" verify read operation, although NMOS transistors 421 and 442 are turned on through the activation of control signals C4 and C10, respectively, the data value of main register 420 does not change. On the other hand, if a memory cell has a threshold voltage greater than or equal to the verify voltage Vvfy1 during the "10" verify read operation, the voltage level of sense node S0 (in accordance with the voltage level of the selected bit line)

increases toward a power supply voltage. When this occurs, the high voltage of sense node S0 turns on NMOS transistor 441 of sense circuit 440. Thus, if a selected memory cell has a threshold voltage that is greater than or equal to verify voltage Vvfy1 during the "10" verify read operation, since NMOS transistors 421 and 442 are turned on by the activation of control signals C4 and C10, respectively, signal path ⑤ (of FIG. 6) is formed. When this occurs, third and fourth latch nodes N3 and N4 are set to a logic low level and a logic high level, respectively. When fourth latch node N4 is set to a logic high level, the selected memory cell is program inhibited during any subsequently executed LSB program loops.

After the "10" verify read operation is executed, data stored in main register 420 is transferred to page buffer decoder circuit 600 through data output circuit 470 by activating control signal C6. For example, when third latch node N3 has a logic low level, NMOS transistor 471 of data output circuit 470 is turned off and, as a result, signal line DOL maintains its pre-charged state (e.g., a logic high level). On the other hand, when third latch node N3 has a logic high level, NMOS transistor 471 is turned on and, as a result, signal line DOL is grounded (see signal path ⑥ of FIG. 6). The logic level of signal line DOL is transferred to a pass/fail check circuit (not shown) through page buffer decoder circuit 600. The pass/fail check circuit determines, based on the data input to the pass/fail check circuit, whether the selected memory cell has been successfully programmed. In accordance with the judgment result, another LSB program loop is executed or the LSB program operation ends.

Figure 7:
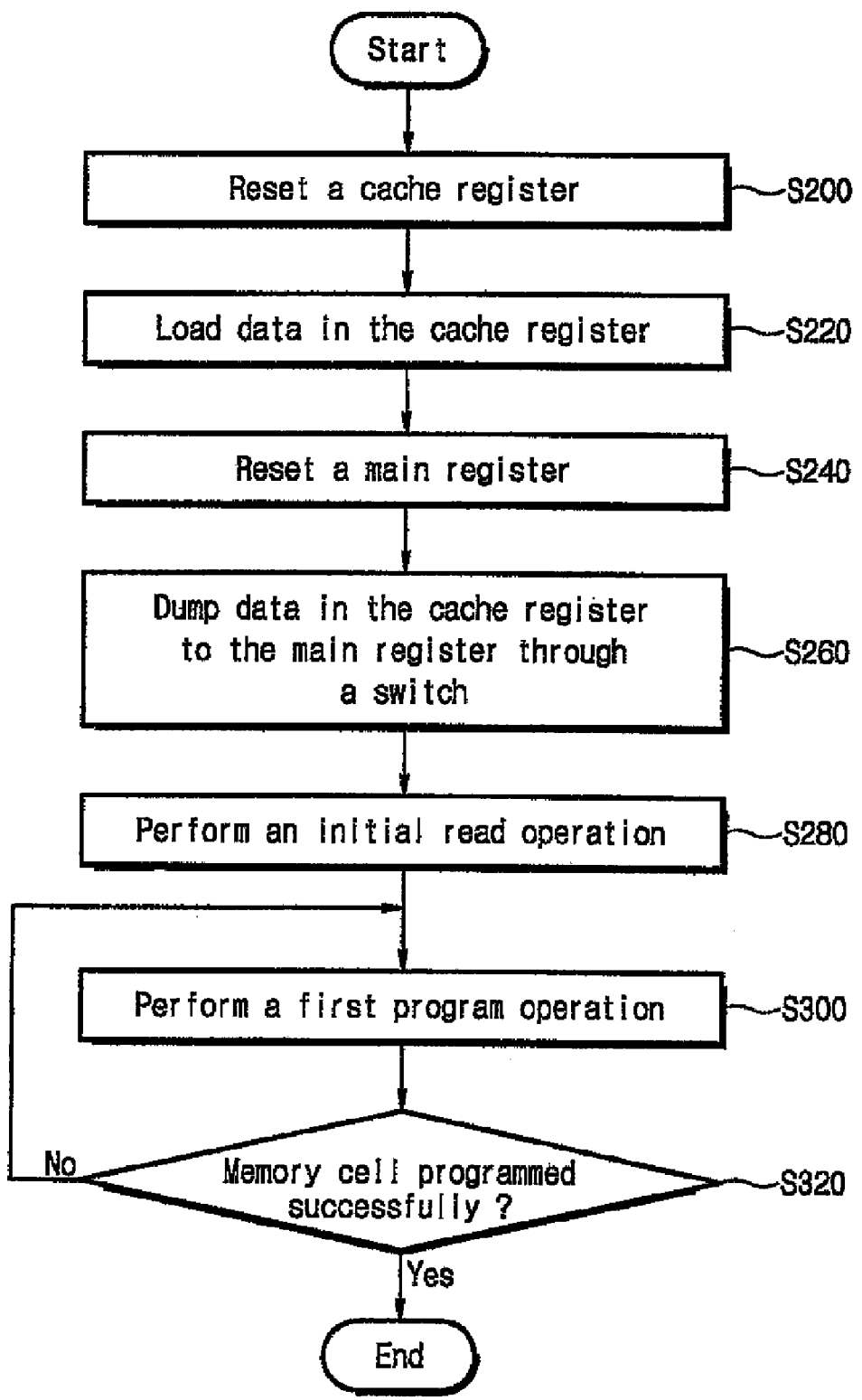
FIG. 7 is a flowchart describing an MSB program operation of a flash memory device in accordance with the present invention.
Figure 8A:
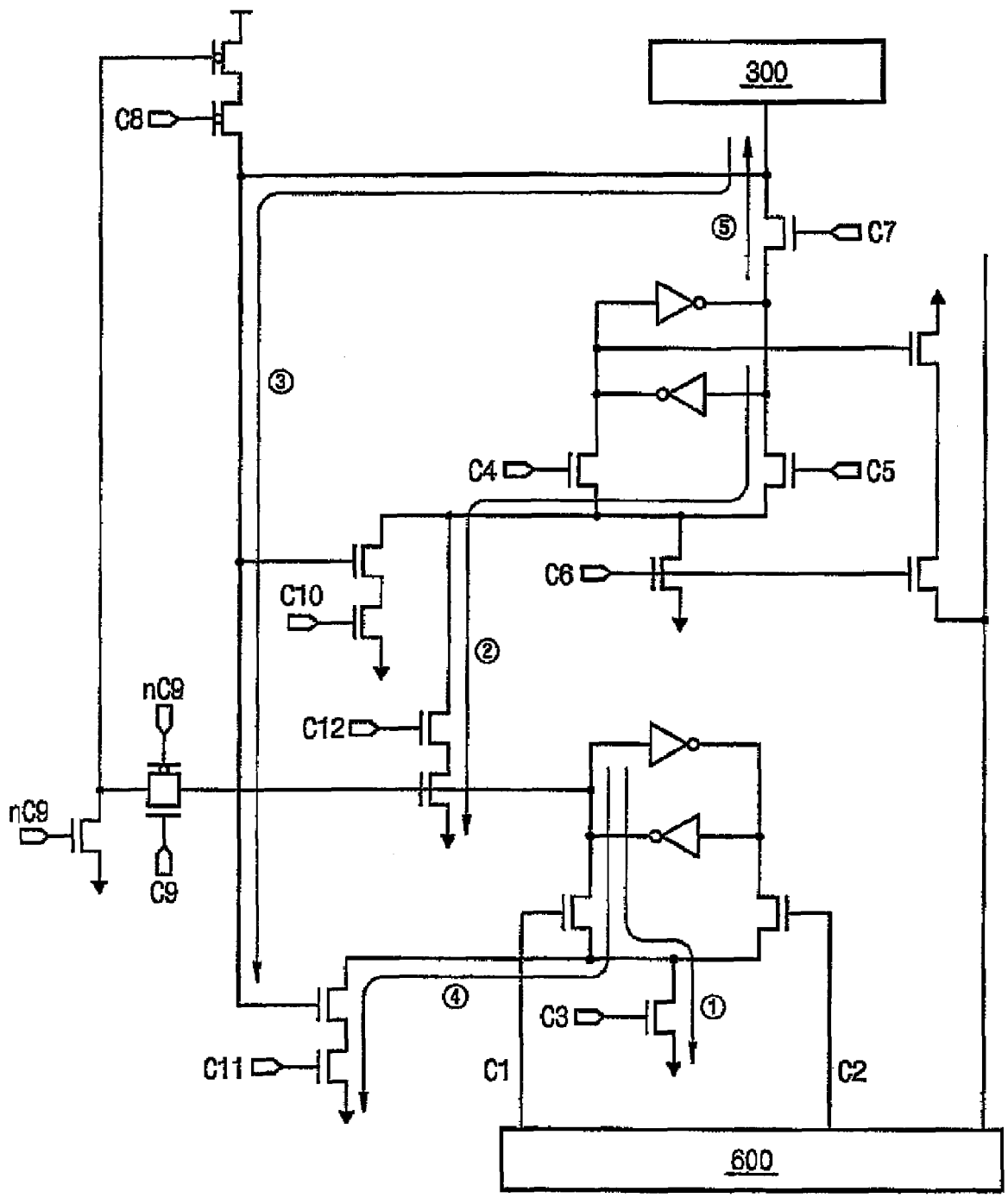
FIGS. 8A and 8B are circuit diagrams illustrating the flow of data through portions of a flash memory device in accordance with the present invention during the MSB program operation.
Figure 8B:
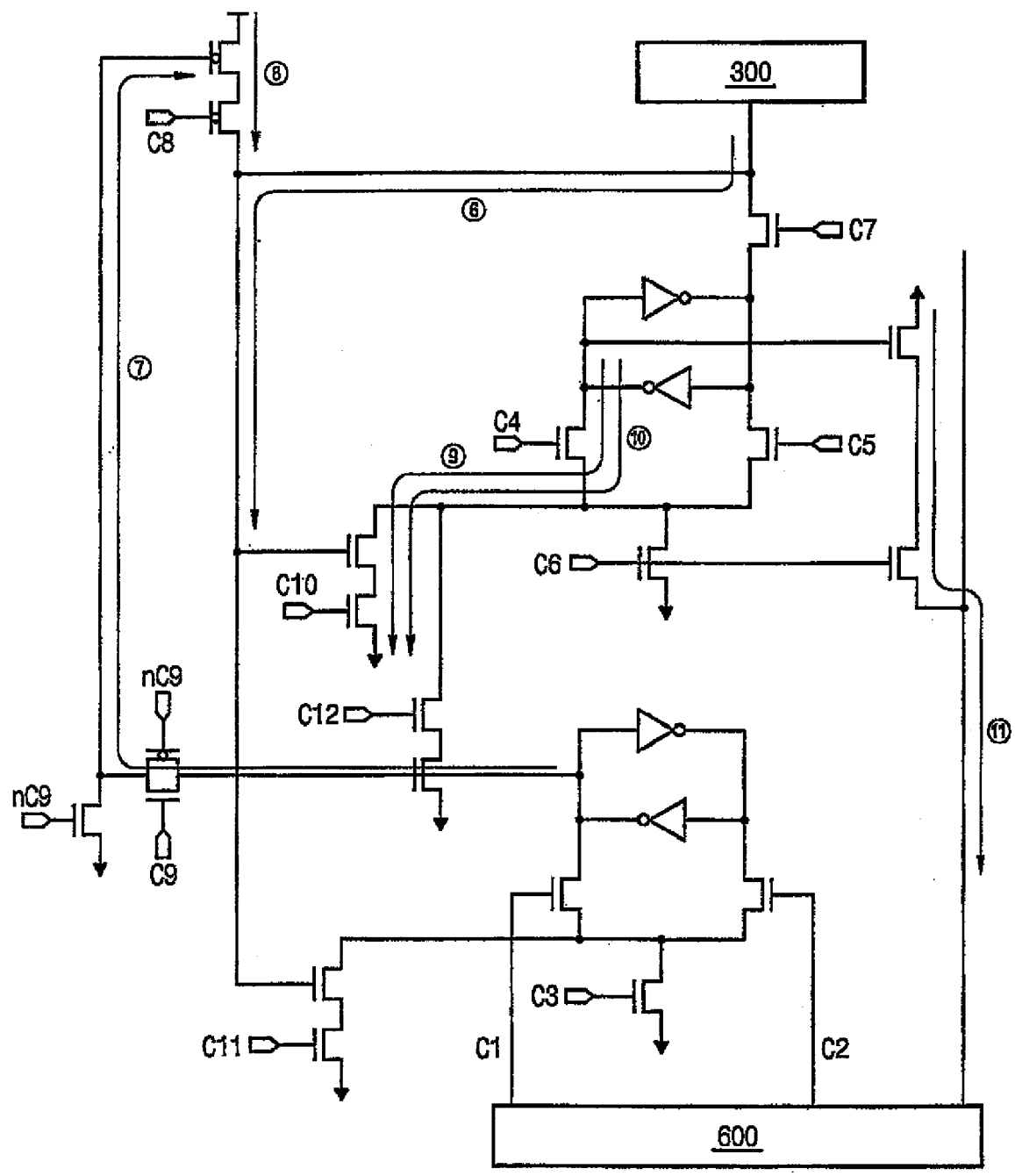

FIG. 7 is a flowchart describing an MSB program operation of a flash memory device in accordance with the present invention, and FIGS. 8A and 8B are circuit diagrams illustrating the flow of data through portions of a flash memory device in accordance with the present invention during the MSB program operation. An MSB program operation will now be described with reference to FIGS. 3, 4B, 7, 8A, and 8B. An MSB program operation is performed through the iteration of MSB program loops. Each MSB program loop comprises an MSB program interval that comprises a first program operation, a first MSB verify read interval that comprises a first MSB verify read operation, and a second MSB verify read interval that comprises a second MSB verify read operation. The first MSB verify read operation is called a "00" verify read operation and the second MSB verify read operation is called a "01" verify read operation. As will be described below, the first and second MSB verify read operations are executed sequentially.

In FIG. 7, steps S200 through S260 of the MSB program operation are the same as steps S100 through S160 of the LSB program operation, respectively, except that in steps S220 and S260, MSB program data is manipulated rather than LSB program data as in steps S120 and S160. Thus, further description of steps S200 through S260 is omitted. Once the MSB program data loaded in cache register 410 is transferred to main register 420 through switch circuit 460 (S260), a read operation, which will be referred to hereinafter as an initial read operation, is executed. During the initial read operation, a first data value that corresponds to the LSB data value that was programmed into the selected memory cell during the LSB program operation is stored in cache register 410 (S280).

During the initial read operation, a second reset operation is performed on latch 416 of cache register 410. That is, latch 416 is reset such that first and second latch nodes N1 and N2 are set to a logic high level and a logic low level, respectively. Then, a read voltage (e.g., a voltage between the threshold voltage distribution for the data value "11" and the threshold voltage distribution for the data value "10") is applied to the selected word line and the resulting voltage variation of the selected bit line is reflected on sense node S0 through signal path ③ of FIG. 8A. For example, when the threshold voltage of a selected memory cell is lower than the read voltage (i.e., when the selected memory cell has a data value of "11"), the voltage level of sense node S0 decreases toward a ground voltage. As a result, NMOS transistor 451 of sense circuit 450 is turned (or remains) off. Thus, signal path ④ (of FIG. 8A) is not formed. So, the data value stored in cache register 410 does not change even though NMOS transistors 411 and 452 are turned on through the activation of control signals C1 and C11 during the initial read operation. Thus, first and second latch nodes N1 and N2 maintain their reset levels of a logic high level and a logic low level, respectively. On the other hand, when the threshold voltage of the selected memory cell is greater than or equal to the read voltage (i.e., when the selected memory cell has a data value of "10"), the voltage level of sense node S0 increases to a power supply voltage and, as a result, NMOS transistor 451 of sense circuit 450 is turned on. When NMOS transistor 451 is turned on during the initial read operation, signal path ④ (of FIG. 8A) is formed, which sets first and second latch nodes N1 and N2 to a logic low level and a logic high level, respectively, since NMOS transistors 411 and 452 are turned on through the activation of control signals C1 and C11.

After the initial read operation, the selected memory cell is programmed in accordance with the MSB program data (S300), which has been stored in main register 420 through steps S200 through S260. When the first program operation is carried out, the voltage of the selected bit line is determined through signal path ⑤ (of FIG. 8A) in accordance with the data stored in main register 420. As mentioned above, the first program operation is well known in the art, so a description thereof is omitted. After the first program operation is performed, an operation is performed to determine whether or not the selected memory cell has been programmed properly (S320). As set forth above, each MSB program loop of comprises a first program operation and "00" and "01" verify read operations. The "00" verify read operation determines whether a selected memory cell was programmed from storing a data value of "10" to storing a data value of "00." The "01" verify read operation determines whether a selected memory cell was programmed from storing a data value of "11" to storing a data value of "01." The "00" and "01" verify read operations will be described in more detail below.

Referring to FIG. 8B, during the "00" verify read operation, a verify voltage is applied to the selected word line and the resulting voltage variation of the selected bit line may be reflected on sense node S0 through signal path ⑥. That is, during the "00" verify read operation, load circuit 430 selectively pre-charges sense node S0, and, if sense node S0 is pre-charged, the pre-charged voltage level of sense node S0 decreases or remains the same in accordance with the threshold voltage of the selected memory cell (i.e., the data value stored in the selected memory cell). As set forth above, control signal C9 is activated during the "00" verify read operation; and thus, sense node S0 is selectively pre-charged in accordance with data value read during the initial read interval. The operation of selectively pre-charging sense node S0 will be described in more detail below.

During the "00" verify read operation, pre-charge control signal C8 is deactivated so that sense node S0 may be pre-charged in accordance with the logic level of first latch node N1. At the same time, control signal C9 is activated, which turns off NMOS transistor 435 of load circuit 430 and connects node N7 to first latch node N1 of cache register 410 through transistors 433 and 434. As described above, when the selected memory cell retains the erased state (i.e., stores a data value of "11") after the LSB program operation, first and second latch nodes N1 and N2 of cache register 410 are set to a logic high level and a logic low level, respectively, during the initial read operation. On the other hand, when the selected memory cell is programmed to store a data value of "10" during the LSB program operation, first and second latch nodes N1 and N2 of cache register 410 are set to a logic low level and a logic high level, respectively, during the initial read operation.

If, after the LSB program operation, the selected memory cell stores a data value of "11," then node N7 of load circuit 430 is set at a logic high level. When node N7 is set to a logic high level, PMOS transistor 431 is turned off; and thus, signal path ⑧ is not formed. Accordingly, sense node S0 is not pre-charged, so NMOS transistor 441 is turned off irregardless of the data value stored in the selected memory cell during the "00" verify read interval. As a result, when first latch node N1 has a logic high level, the data stored in main register 420 is retained without change during the "00" verify read interval. On the other hand, if, during the LSB program operation, the selected memory cell was programmed to store a data value of "10," node N7 of load circuit 430 is set to a logic low level during the "00" verify read operation. When node N7 is set to a logic low level, PMOS transistor 431 is turned on. Accordingly, signal path ⑧ is formed; and thus, sense node S0 is pre-charged through PMOS transistors 431 and 432. After sense node S0 is pre-charged, the voltage level of sense node S0 varies in accordance with the data value stored in the selected memory cell. For example, when the selected memory cell was programmed from storing a data value of "10" to storing a data value of "00" during the first program operation of the MSB program operation, the voltage of sense node S0 rises above the threshold voltage of NMOS transistor 441 in sense circuit 440. Thus, NMOS transistor 441 is turned on, forming signal path ⑨ (of FIG. 8B); and thus, the data stored in main register 420 is changed. That is, third and fourth latch nodes N3 and N4 are set to a logic low level and a logic high level, respectively, indicating that the selected memory cell was programmed from storing a data value of "10" to storing a data value of "00." However, if the selected memory cell was not programmed from storing a data value of "10" to storing a data value of "00" during the first program operation of the MSB program operation, but was programmed to store a data value of "10" during the LSB program operation, the data latched in main register 420 does not change.

In accordance with the "00" verify read operation described above, if the data in main register 420 corresponds to the operation of programming a memory cell storing the data value "11" to storing the data value "01," the data in main register 420 is maintained as program-enable data during the "00" verify read operation sense node S0 is not pre-charged since signal path ⑧ (of FIG. 8B) is not formed. On the other hand, if data in main register 420 corresponds to the operation of programming a memory cell from storing the data value "10" to storing the data value "00," the data in main register 420 is changed to program-inhibit data when the memory cell reaches a threshold voltage corresponding to the data value "00" during the "00" verify read operation, because sense node S0 is pre-charged through signal path ⑧ (of FIG. 8B).

Referring to FIG. 8B, the "01" verify read operation will now be described. The "01" verify read operation is performed following the "00" verify read operation. During the "01" verify read operation, control signal C9 is deactivated so that the gate of PMOS transistor 431 is grounded through NMOS transistor 435, and so that node N7 and first latch node N1 are electrically isolated from each other. Also, pre-charge control signal C8 is deactivated during the "01" verify read operation. Thus, a pre-charge operation is normally performed by load circuit 430 during the "01" verify read operation. During the "01" verify read operation, a verify voltage Vvfy3 (refer to FIG. 4B) is applied to the selected word line and the resulting voltage variation of the selected bit line is reflected on sense node S0 through signal path ⑥ of FIG. 8B. For example, if the selected memory cell has a threshold voltage that is lower than verify voltage Vvfy3, the voltage level of sense node S0 decreases toward the ground voltage. As a result, NMOS transistor 441 in sense circuit 440 is turned off. On the other hand, if the selected memory cell has a threshold voltage that is greater than or equal to verify voltage Vvfy3, the voltage level of the selected bit line increases toward the power supply voltage, which turns on NMOS transistor 441 in sense circuit 440. Control signals C4 and C10 are activated during the "10" verify read operation, and thus turn on NMOS transistors 421 and 442, respectively. When NMOS transistor 441 is turned off, signal path ⑩ of FIG. 8B is not formed, so data in main register 420 is retained as program-enable data. When NMOS transistor 441 is turned on, signal path ⑩ of FIG. 8B is formed, so data in main register 420 is changed to program-inhibit data.

After the "01" verify read operation is executed, data stored in main register 420 is transferred to page buffer decoder circuit 600 through data output circuit 470 by enabling control signal C6. For example, when third latch node N3 has a logic low level, NMOS transistor 471 of data output circuit 470 is turned off. When NMOS transistor 471 is turned off, signal line DOL maintains its pre-charged level. On the other hand, when third latch node N3 has a logic high level, NMOS transistor 471 is turned; and thus, signal line DOL is grounded through signal path ⑪ of FIG. 8B. The logic state of signal line DOL is transferred to a well-known pass/fail check circuit through page buffer decoder circuit 600. The pass/fail check circuit determines, based on the data input to the pass/fail check circuit, whether the selected memory cell has been successfully programmed. Based on the judgment result, another MSB program loop is performed or the MSB program operation ends.

Figure 9A:
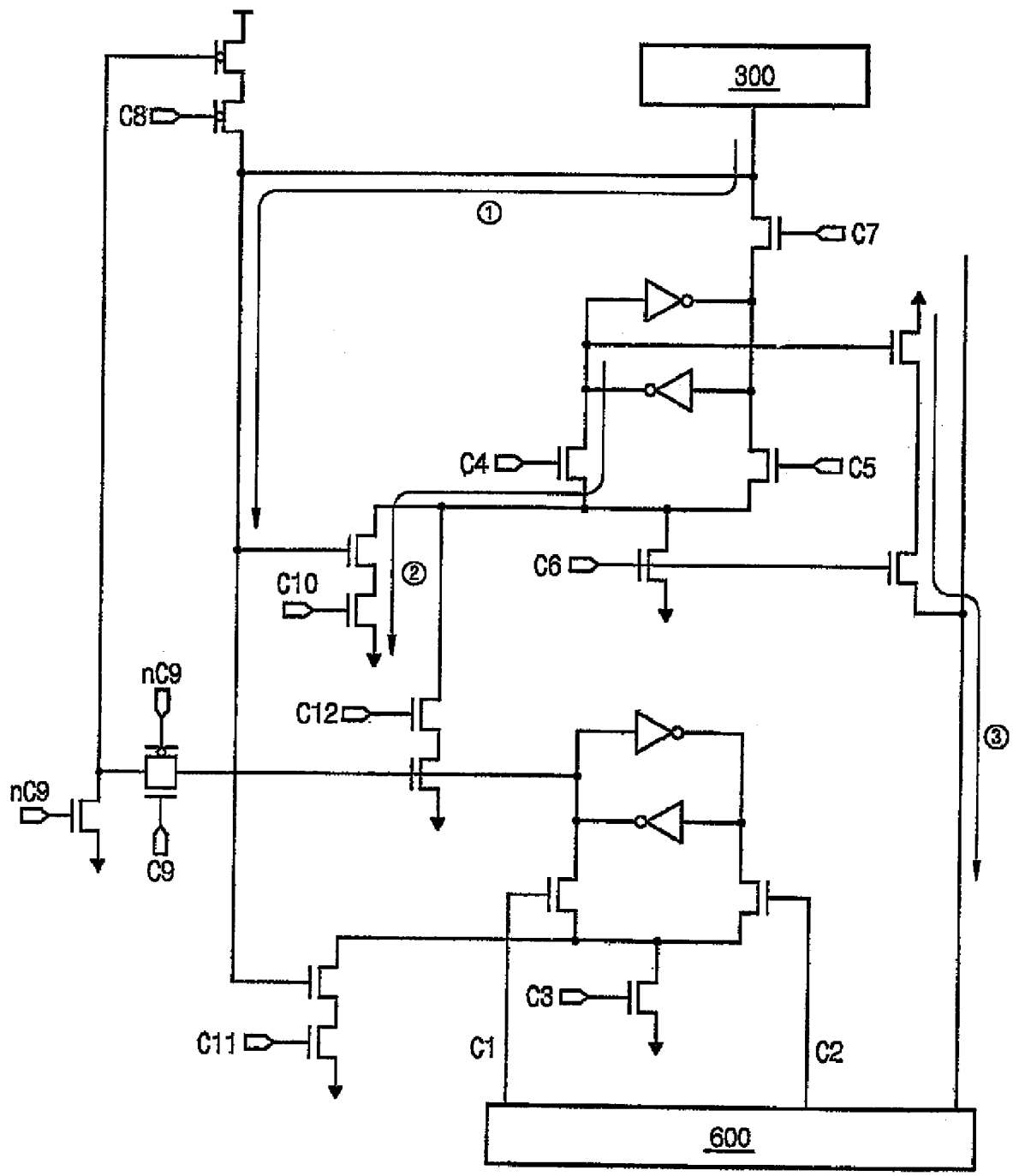
FIG. 9A is a circuit diagram illustrating the flow of data through portions of a flash memory device in accordance with the present invention during an MSB read operation.
Figure 9B:
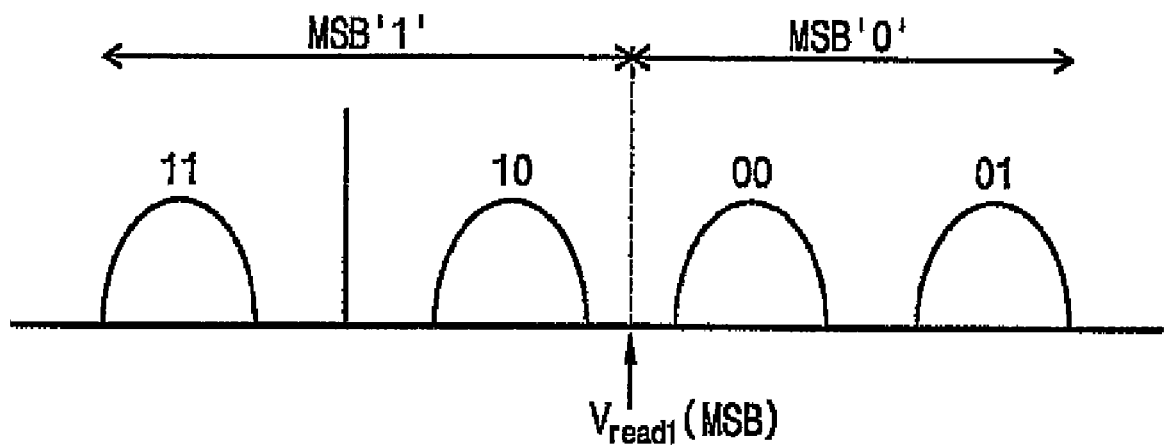
FIG. 9B shows a read voltage applied to the selected word line during an MSB read operation.

FIG. 9A is a circuit diagram illustrating the flow of data through portions of a flash memory device in accordance with the present invention during an MSB read operation, and FIG. 9B shows a read voltage applied to the selected word line during an MSB read operation. In accordance with the present invention, a memory cell may store one of four data values: "11," "10," "00," or "01." As illustrated in FIG. 9B, the four data values "11," "10," "00," and "01" are assigned, respectively, over four threshold voltage distributions that are arranged in ascending order with regard to voltage level. Accordingly, it is possible to read the MSB data stored in a selected memory cell by determining whether the data value stored in the selected memory cell is in a first or a second data value group, wherein the first data value group comprises the data values "11" and "10," and the second data value group comprises the data values "00" and "01." If the data value stored in the selected memory cell is "11" or "10" (i.e., in the first data value group), then the MSB is "1," and if the data value stored in the selected memory cell is "00" or "01" (i.e., in the second data value group), then the MSB is "0". An MSB read operation will now be described with reference to FIGS. 3, 9A, and 9B.

During the MSB read operation, a read voltage Vread1 (refer to FIG. 9B) is applied to the selected word line and the resulting voltage variation of the selected bit line is reflected on sense node S0 through signal path ① of FIG. 9A. When the selected memory cell has a threshold voltage that is lower than read voltage Vread1, the voltage level of sense node S0 decreases toward the ground voltage, which turns off NMOS transistor 441 in sense circuit 440. On the other hand, when the selected memory cell has a threshold voltage that is greater than or equal to read voltage Vread1, the voltage level of sense node S0 increases toward the power supply voltage, which turns on NMOS transistor 441.

During the MSB read operation, control signals C4 and C10 are activated, turning on NMOS transistors 421 and 442, respectively. Thus, if the voltage of sense node S0 decreases to the ground voltage, signal path ② of FIG. 9A is not formed. If the voltage of sense node S0 increases toward the power supply voltage, signal path ② of FIG. 9A is formed. Then, data stored in main register 420 is transferred to page buffer decoder circuit 600 through data output circuit 470 by enabling control signal C6 and either forming signal path ③ or not, as described above in regard to previous operations (e.g., the "10" verify read operation and signal path ⑥ of FIG. 6). MSB data transferred to page buffer decoder circuit 600 is transferred outside of flash memory device 1000 (of FIG. 2) through a data line bus.

Figure 10A:
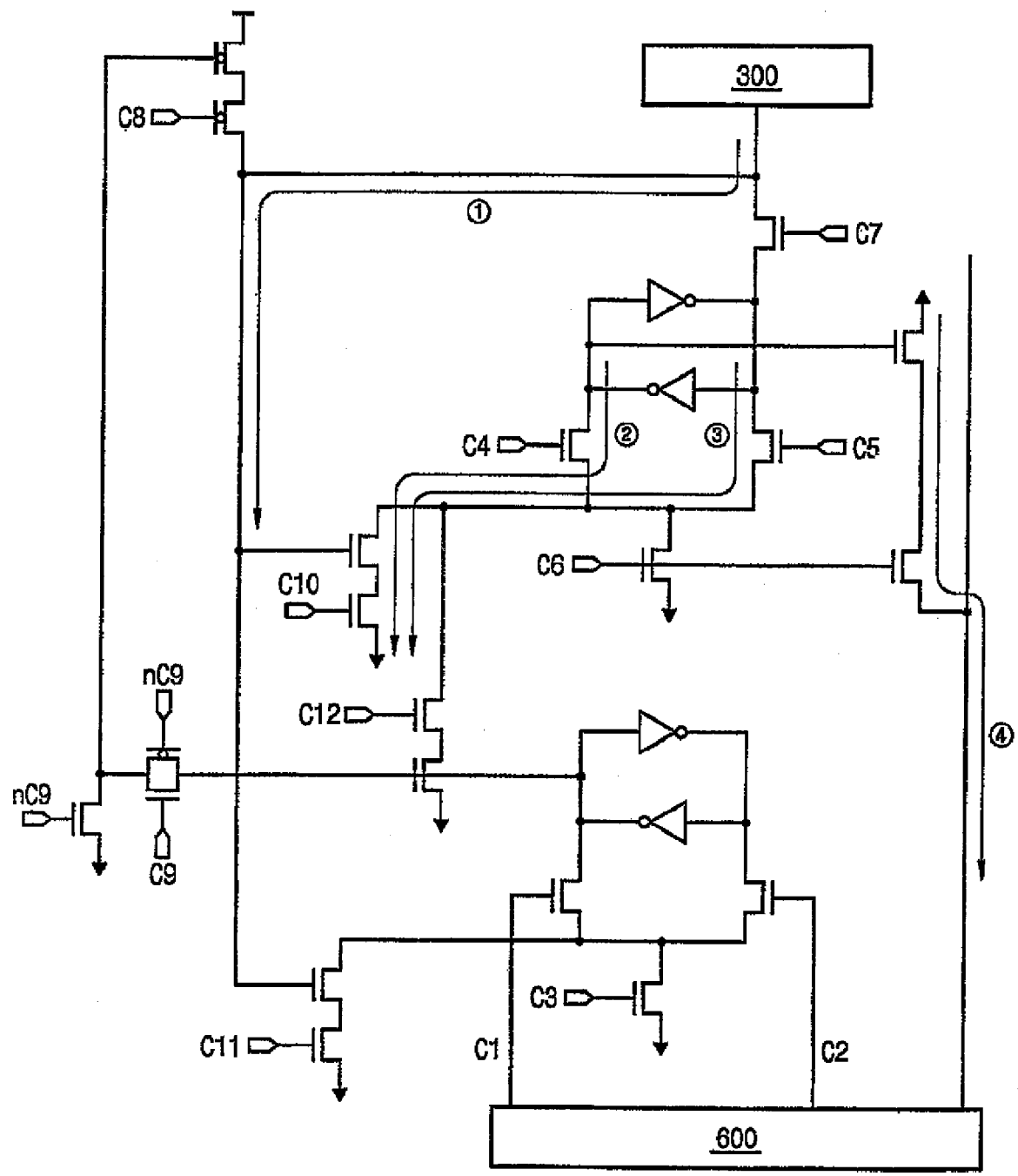
FIG. 10A is a circuit diagram illustrating the flow of data through portions of a flash memory device in accordance with the present invention during an LSB read operation.
Figure 10B:
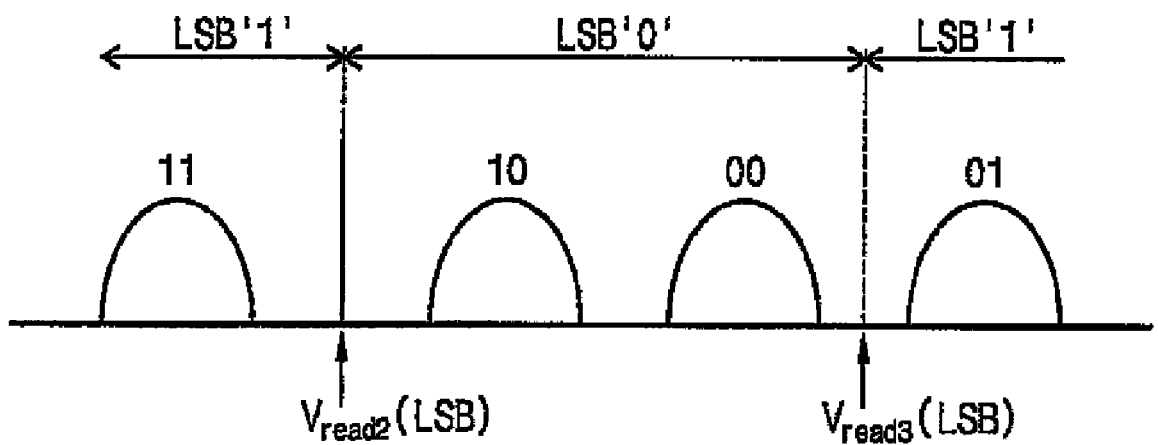
FIG. 10B shows read voltages applied to the selected word line during an LSB read operation.

FIG. 10A is a circuit diagram illustrating the flow of data through portions of a flash memory device in accordance with the present invention during an LSB read operation, and FIG. 10B shows read voltages applied to the selected word line during an LSB read operation. An LSB read operation, which comprises a first LSB sense operation and a second LSB sense operation, will now be described in detail with reference to FIGS. 3, 10A, and 10B.

During the first LSB sense operation of the LSB read operation, a read voltage Vread2 (refer to FIG. 10B) is applied to the selected word line and the resulting voltage variation of the selected bit line is reflected on sense node S0 through signal path ① of FIG. 10A. When the selected memory cell has a threshold voltage that is lower than read voltage Vread2, the voltage level of sense node S0 decreases toward the ground voltage, which turns off NMOS transistor 441 in sense circuit 440. On the other hand, when the selected memory cell has a threshold voltage that is greater than or equal to read voltage Vread2, the voltage level of sense node S0 increases toward the power supply voltage, which turns on NMOS transistor 441. Also, during the LSB read operation, control signals C4 and C10 are activated, and thus turn on NMOS transistors 421 and 442, respectively. Thus, if the voltage of sense node S0 decreases to the ground voltage, signal path ② of FIG. 10A is not formed. If the voltage of sense node S0 increases toward the power supply voltage, then signal path ② of FIG. 10A is formed.

Then, during a second LSB sense operation of the LSB read operation, a read voltage Vread3 (refer to FIG. 10B) is applied to the selected word line, and the voltage variation of the selected bit line is reflected on sense node S0 through signal path ① of FIG. 10A. When the selected memory cell has a threshold voltage that is lower than read voltage Vread3, the voltage level of sense node S0 decreases toward the ground voltage, which turns off NMOS transistor 441 in sense circuit 440. On the other hand, when the selected memory cell has a threshold voltage that is greater than or equal to read voltage Vread1, the voltage level of sense node S0 increases toward the power supply voltage, which turns on NMOS transistor 441. Also, during the second LSB sense operation, control signals C5 and C10 are activated, and thus turn on NMOS transistors 422 and 442. Thus, if the voltage level of sense node S0 decreases to the ground voltage, signal path ③ of FIG. 10A is not formed. If the voltage of sense node S0 increases toward the power supply voltage, signal path ③ of FIG. 10A is formed.

Subsequently, LSB data stored in main register 420 is transferred to page buffer decoder circuit 600 through data output circuit 470 by enabling control signal C6 and either forming signal path ③ or not, as described in regard to previous operations. LSB data transferred to page buffer decoder circuit 600 is transferred outside of flash memory device 1000 (of FIG. 2) through a data line bus.

A page buffer circuit of a flash memory device in accordance with the present invention performs program and read functions for multi-bit data, and also performs cache program and page copy-back functions for single-bit data. The cache program and page copy-back operations will be described below.

In a cache program operation, during the execution of the first program operation described above, data to be programmed during the next first program operation is loaded into the cache register.

Figure 11:
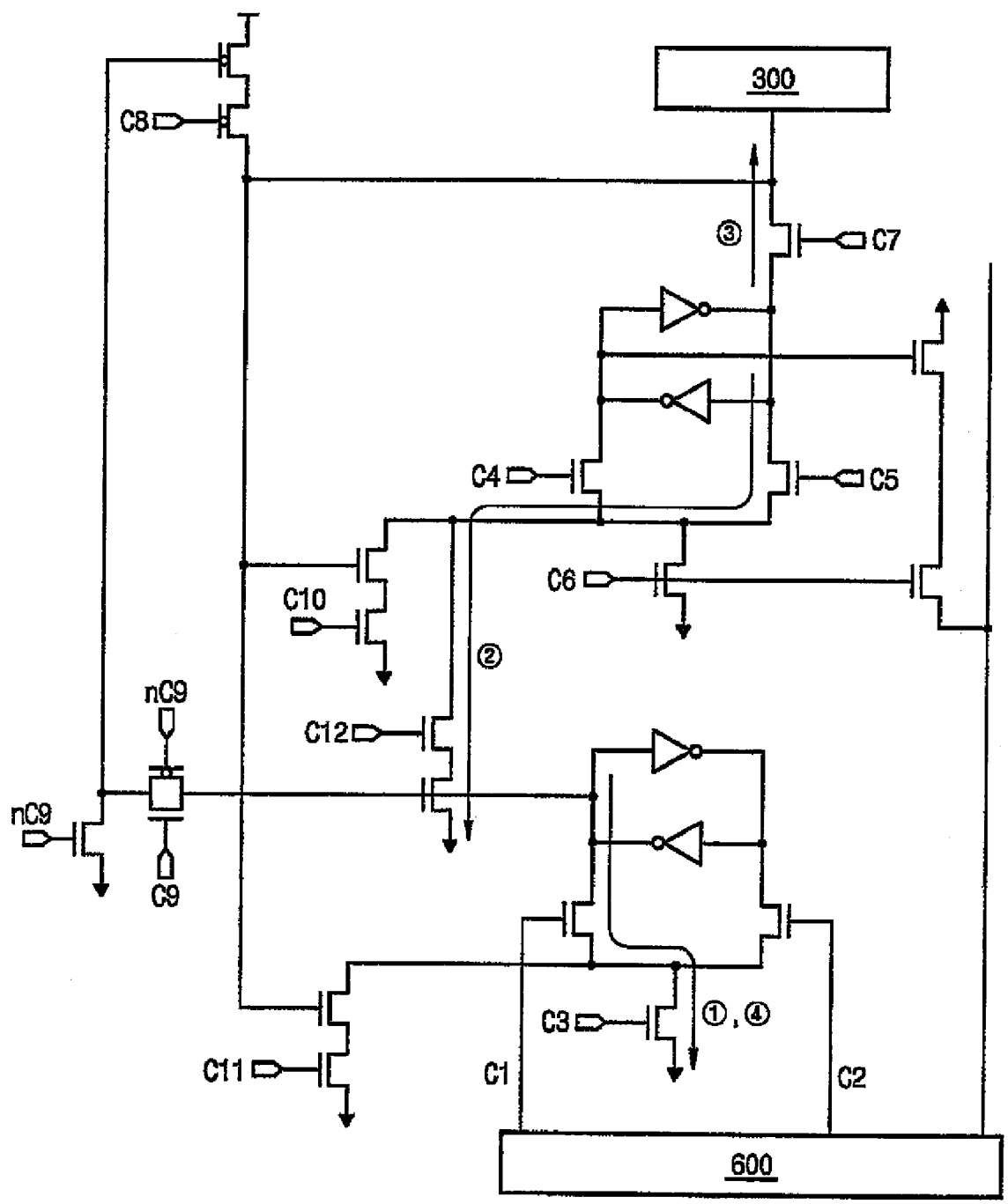
FIG. 11 is a circuit diagram illustrating the flow of data through portions of a flash memory device in accordance with the present invention during a cache program operation.

The cache program operation will now be described in more detail with reference to FIGS. 3 and 11. Program data is first loaded into cache register 410 through signal path ① of FIG. 11, and the data in cache register 410 is then transferred into main register 420 through signal path ② of FIG. 11. Once program data is transferred to main register 420, the voltage level of the selected bit line is determined in accordance with the data loaded in main register 420 through a signal path ③. The operational steps illustrated by signal paths ①, ②, and ③ in FIG. 11 are the same as those described above with reference to FIG. 6, so description thereof is omitted. Then, a first program operation is performed, wherein the first program operation is the same as the first program operation mentioned previously. As mentioned previously, the first program operation is well known in the art, so a description thereof is omitted. While the data in main register 420 is programmed, program data corresponding to the data value that will be programmed next is loaded into cache register 410 through signal path ④ of FIG. 11. The preceding operational steps are repeated in the manner described above with reference to FIG. 11 until the desired amount of data has been programmed.

Figure 12A:
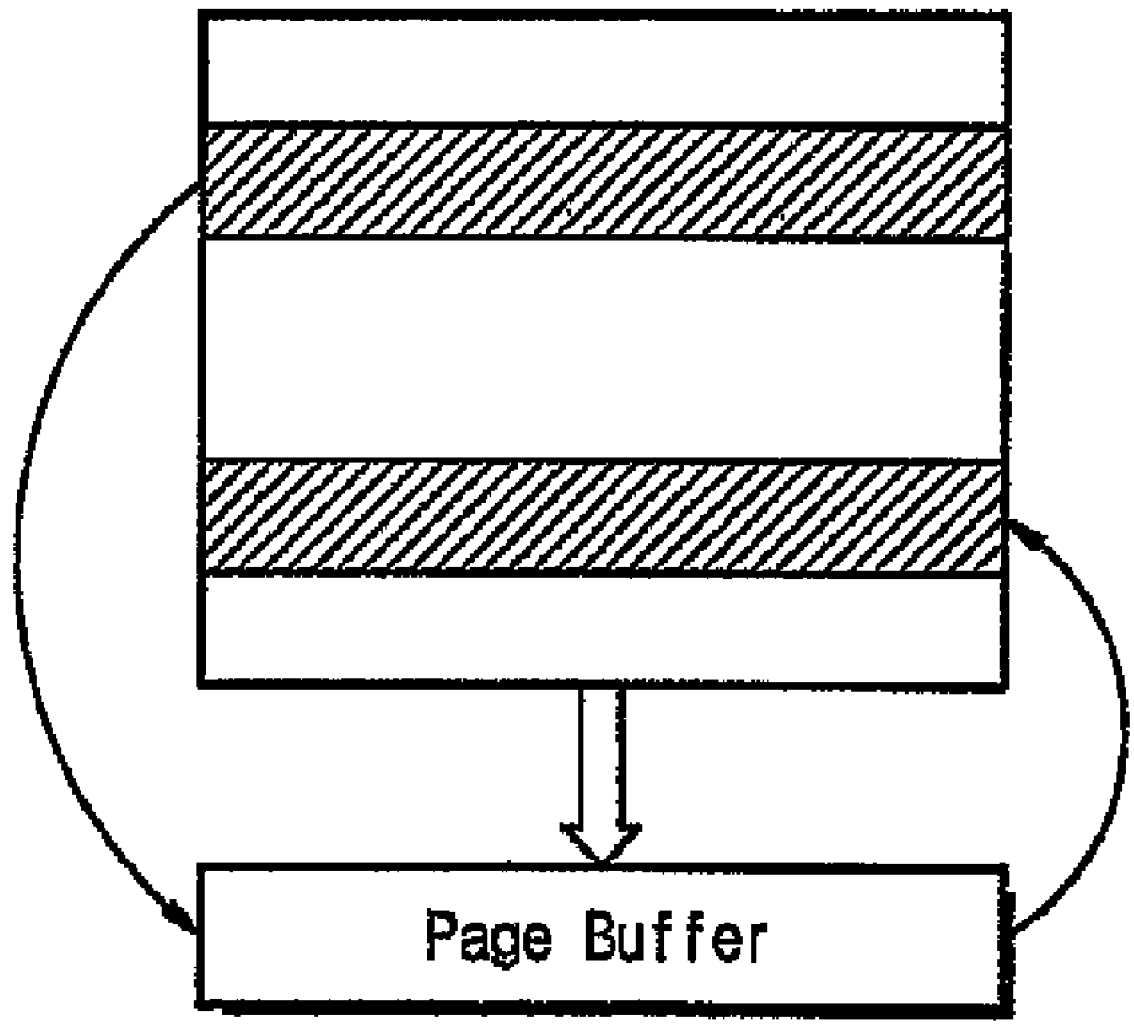
FIG. 12A is a diagram illustrating a page copy-back operation of a flash memory device in accordance with the present invention.
Figure 12B:
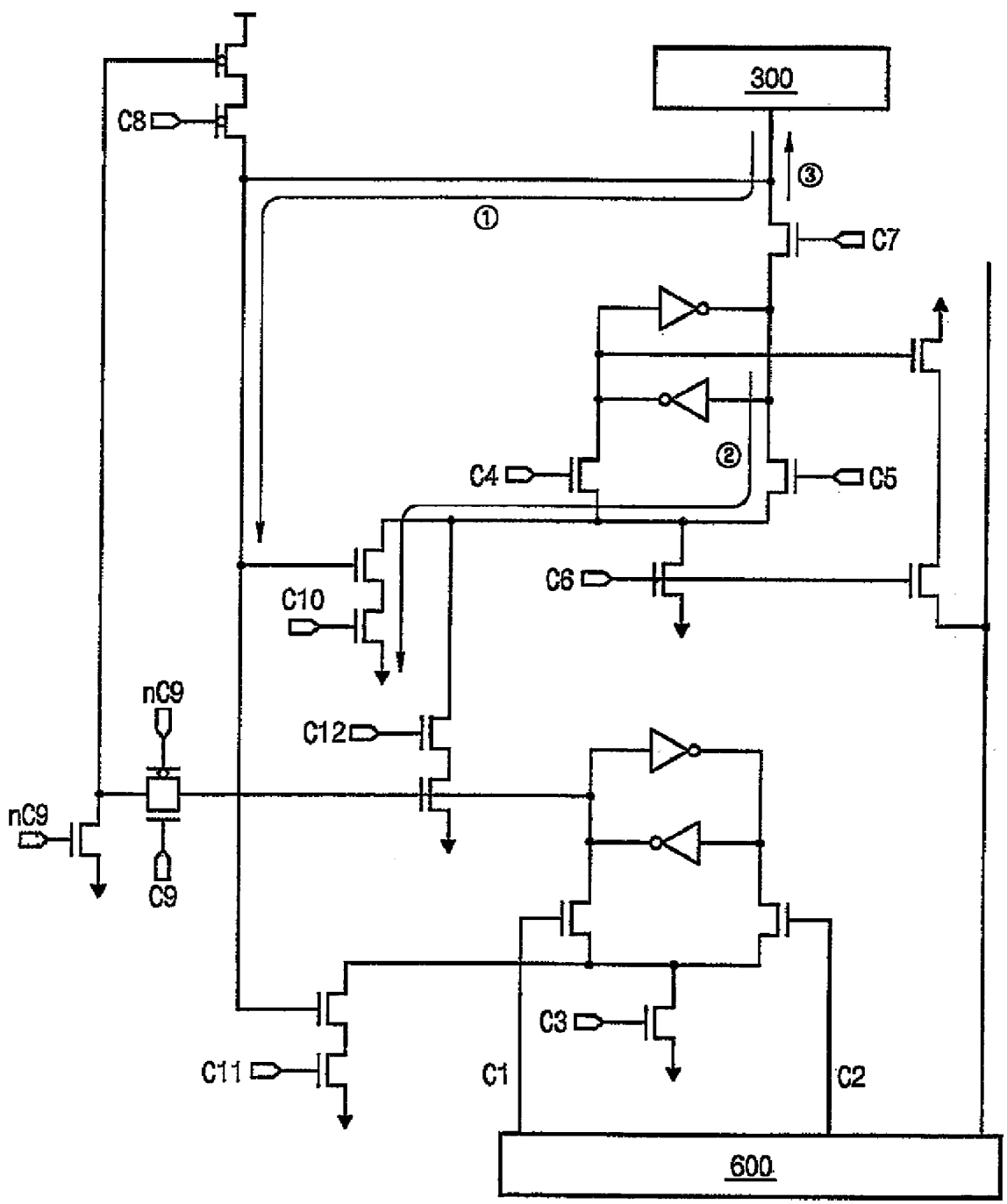
FIG. 12B is a circuit diagram illustrating the flow of data through portions of a flash memory device in accordance with the present invention during the page copy-back operation of 12A.

In a page copy-back operation, as illustrated in FIG. 12A, a page buffer circuit reads data stored in one page, and then programs that data into another page. Referring to FIG. 12B, which illustrates the flow of data through portions of a flash memory device in accordance with the present invention during a page copy-back operation, and FIG. 3, data read through signal paths ① and ② of FIG. 12B is stored in main register 420. The data stored in main register 420 is then programmed into another page through signal path ③ of FIG. 12B. The operational steps illustrated by signal paths ① and ③ of FIG. 12B are the same as those described above with reference to signal paths ④ and ③ of FIG. 6, respectively, so description thereof is omitted here. Also, the operational step illustrated by signal path ② of FIG. 12B is the same as the operational step described above with reference to signal path ③ of FIG. 10A, so a description thereof is omitted here.

Figure 13A:
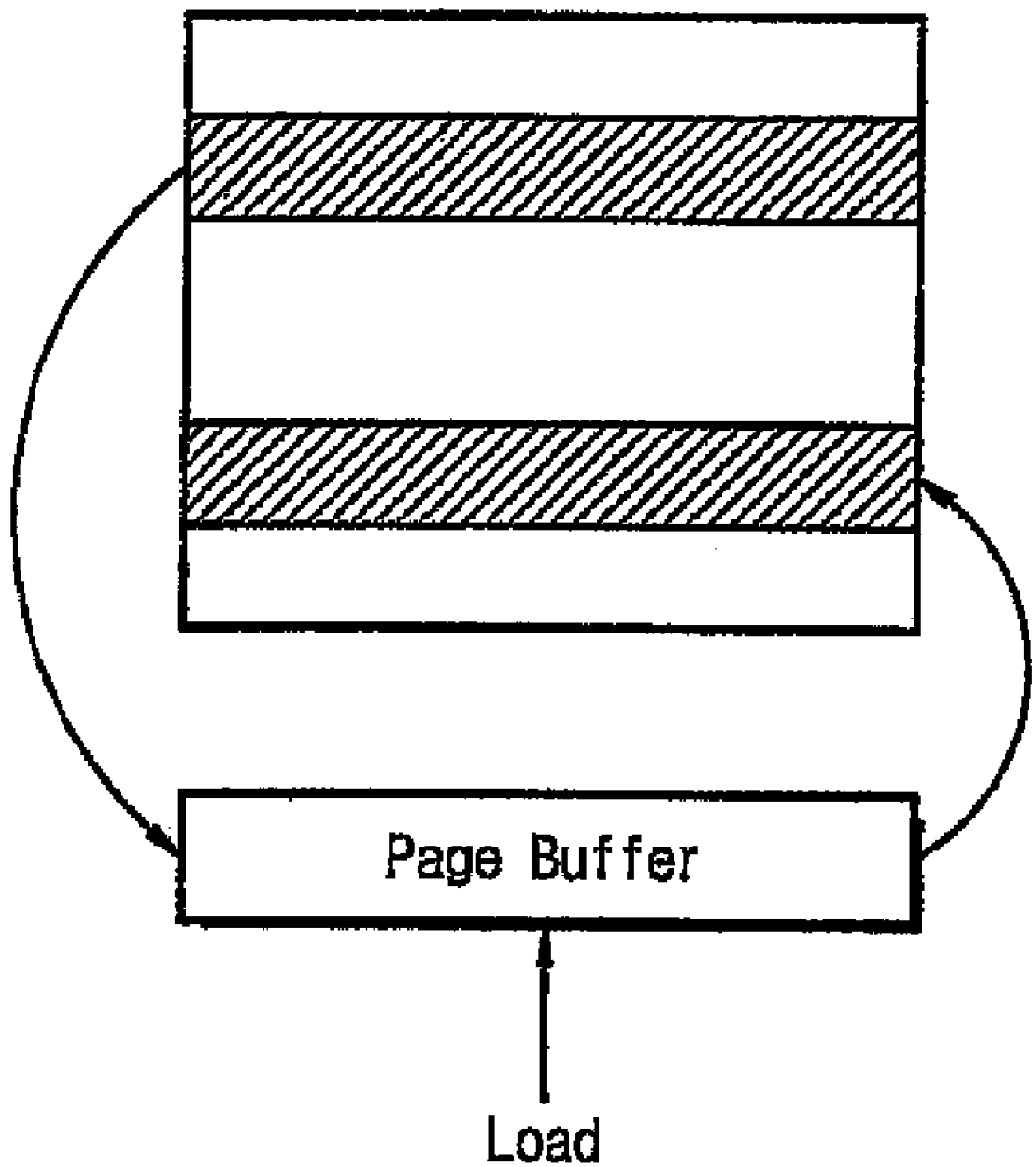
FIG. 13A is a diagram illustrating a page copy-back operation in accordance with the present invention; and, FIG. 13B illustrates the flow of data through portions of a flash memory device in accordance with the present invention during the page copy-back operation of FIG. 13A.
Figure 13B:
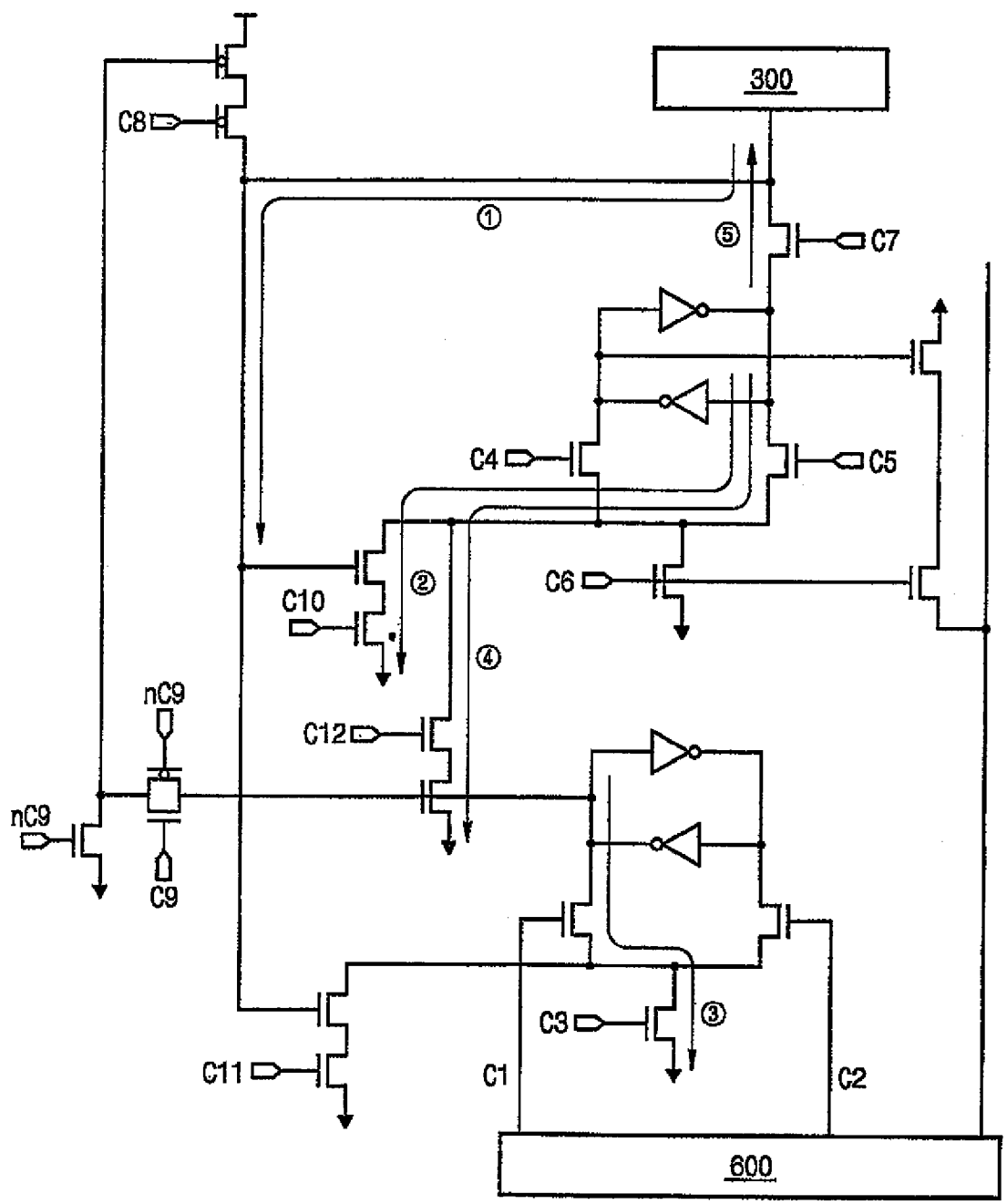

It is possible to update a portion of the data read from one page during a page copy-back operation. That is, as illustrated in FIG. 13A, a page buffer circuit reads data stored in one page, and data to be updated is loaded into the page buffer circuit. Then, data stored in the page buffer circuit is programmed into another page. FIG. 13B illustrates the flow of data through portions of a flash memory device in accordance with the present invention during a page copy-back operation. Referring to FIGS. 3 and 13B, data is first read through signal path ① of FIG. 13B, and then is stored in main register 420 through signal path ② of FIG. 13B. Data to be updated is then loaded into cache register 410 through signal path ③ of FIG. 13B in the same manner as described above with reference signal path ① of FIG. 6. Then, data in cache register 410 is transferred to main register 420 through signal path ④ of FIG. 13B, and data stored in main register 420 is then programmed into another page through signal path ⑤ of FIG. 13B. The operational steps that correspond to signal paths ①, ②, ③, ④ and ⑤ of FIG. 13B are the same as those described above with reference to signal paths ④, ⑤, ①, ②, and ③ of FIG. 6, respectively, so the description thereof is omitted here.

The activations of the various control signals within a page buffer is not limited to the exemplary activations described above. For example, it will be clear to one skilled in the art that the activation of various control signals within a page buffer can be changed in accordance with reset states of the latches in registers 410 and 420. Also, it will be clear to one of ordinary skill in the art that single-bit program and read operations may also be performed in a flash memory device comprising a page buffer in accordance with an embodiment of the invention.

As described above, it is possible to perform various operations in a flash memory device comprising a single page buffer structure.

The operations described above are each performed in relation to a single memory cell; however, it will be clear to one of ordinary skill in the art that the operations could be applied to multiple memory cells in various ways.

The invention has been described with reference to exemplary embodiments. However, it will be understood that the scope of the invention is not limited to the disclosed embodiments, but rather is intended to cover various modifications, adaptations, and alternate arrangements. The scope of the claims, therefore, should be accorded the broadest interpretation so as to encompass all such modifications, adaptations and alternative arrangements.

What is claimed is:

1. A multi-bit program method for a flash memory device comprising memory cells arranged along a plurality of bit lines and a plurality of word lines, the method comprising:
    an MSB program operation comprising:
        storing a first data value in a first sense and register circuit during an initial read interval, wherein the first data value corresponds to a second data value stored in a selected memory cell;
        selectively pre-charging a sense node in accordance with the first data value during a "00" verify read interval; and,
        storing a third data value in a second sense and register circuit during the "00" verify read interval, wherein the third data value corresponds to a fourth data value stored in the selected memory cell.

2. The method of claim 1, wherein, if the second data value is "11," the sense node is not pre-charged during the "00" verify read interval.

3. The method of claim 1, wherein, if the second data value is "10," the sense node is pre-charged during the "00" verify read interval.

4. The method of claim 1, further comprising:
    storing program data in the first sense and register circuit during a data dump interval, wherein the program data is provided by a page buffer decoder circuit.

5. The method of claim 1, further comprising an LSB program operation comprising:
    performing a first reset operation on the first sense and register circuit;
    storing LSB program data in the first sense and register circuit during a first data load interval;
    performing a first reset operation on the second sense and register circuit;
    transferring data from the first sense and register circuit to the second sense and register circuit during a first data dump interval; and,
    performing a first program operation during an LSB program interval.

6. The method of claim 1, further comprising:
    performing a second reset operation on the first sense and register circuit during the initial read interval of the MSB program operation before storing the first data value in the first sense and register circuit during the initial read interval.

7. The method of claim 1, further comprising:
    applying a first verify voltage to a selected word line before storing the first data value in the first sense and register circuit during the initial read interval of the MSB program operation.

8. The method of claim 1, further comprising:
    performing a first program operation before selectively pre-charging the sense node in accordance with the first data value during the "00" verify read interval of the MSB program operation.

9. The method of claim 1, wherein the MSB program operation further comprises:
    performing a first reset operation on the first sense and register circuit;
    storing MSB program data into the first sense and register circuit during a second data load interval;
    performing a first reset operation on the second sense and register circuit; and,
    transferring data from the first sense and register circuit to the second sense and register circuit during a second data dump interval.

10. The method of claim 1, wherein the MSB program operation further comprises:
    performing a "01" verify operation after the "00" verify read interval and during a "01" verify read interval, wherein the "01" verify read interval occurs after the "00" verify read interval.

11. The method of claim 10, wherein the "01" verify operation comprises pre-charging the sense node.

* * * * *